(12) United States Patent
Oto

(10) Patent No.: US 10,526,197 B2
(45) Date of Patent: Jan. 7, 2020

(54) SUBSTRATE FOR SENSOR, PHYSICAL QUANTITY DETECTION SENSOR, ACCELERATION SENSOR, ELECTRONIC APPARATUS, VEHICLE, AND METHOD OF MANUFACTURING SUBSTRATE FOR SENSOR

(71) Applicant: SEIKO EPSON CORPORATION, Tokyo (JP)

(72) Inventor: Masayuki Oto, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 235 days.

(21) Appl. No.: 15/695,690

(22) Filed: Sep. 5, 2017

(65) Prior Publication Data

US 2018/0065840 A1 Mar. 8, 2018

(30) Foreign Application Priority Data

Sep. 7, 2016 (JP) .................. 2016-174308

(51) Int. Cl.
| | |
|---|---|
| B81B 3/00 | (2006.01) |
| B81C 1/00 | (2006.01) |
| G01P 15/10 | (2006.01) |
| G01P 15/12 | (2006.01) |
| G01P 15/08 | (2006.01) |
| G01P 15/09 | (2006.01) |
| G01P 15/097 | (2006.01) |
| G01C 19/5726 | (2012.01) |

(52) U.S. Cl.
CPC .......... *B81B 3/0021* (2013.01); *B81B 3/0051* (2013.01); *B81C 1/0015* (2013.01); *G01P 15/0802* (2013.01); *G01P 15/097* (2013.01); *G01P 15/0922* (2013.01); *G01P 15/10* (2013.01); *G01P 15/123* (2013.01); *B81B 2201/0235* (2013.01); *B81B 2203/0118* (2013.01); *G01C 19/5726* (2013.01)

(58) Field of Classification Search
CPC combination set(s) only.
See application file for complete search history.

(56) References Cited

U.S. PATENT DOCUMENTS

| | | | | |
|---|---|---|---|---|
| 2008/0257044 A1* | 10/2008 | Watanabe | .......... | G01C 19/5663 73/504.15 |
| 2012/0227274 A1 | 9/2012 | Watanabe et al. | | |
| 2013/0167669 A1* | 7/2013 | Watanabe | ............... | G01P 15/09 73/865 |

FOREIGN PATENT DOCUMENTS

| | | |
|---|---|---|
| JP | 2000-338124 A | 12/2000 |
| JP | 2010-183208 A | 8/2010 |
| JP | 2012-189480 A | 10/2012 |

* cited by examiner

*Primary Examiner* — Ratisha Mehta
(74) *Attorney, Agent, or Firm* — Oliff PLC

(57) ABSTRACT

A cantilever section as a substrate for a sensor includes: a base section; a movable section connected to the base section; an arm portion as a support portion extending along the movable section from the base section when viewed in a planar view as viewed from a thickness direction of the movable section; and a gap portion formed to have a predetermined gap between the movable section and the arm portion when viewed in the planar view, in which a ridge portion formed as an etching residue having a top portion on the side facing the gap portion is provided on each of facing surfaces of the movable section and the arm portion in the gap portion, and the predetermined gap is a gap between a top portion of a first ridge portion which is the ridge portion formed at one of the movable section and the arm portion, and a top portion of a second ridge portion which is the ridge portion formed at the other of the movable section and the arm portion.

21 Claims, 16 Drawing Sheets

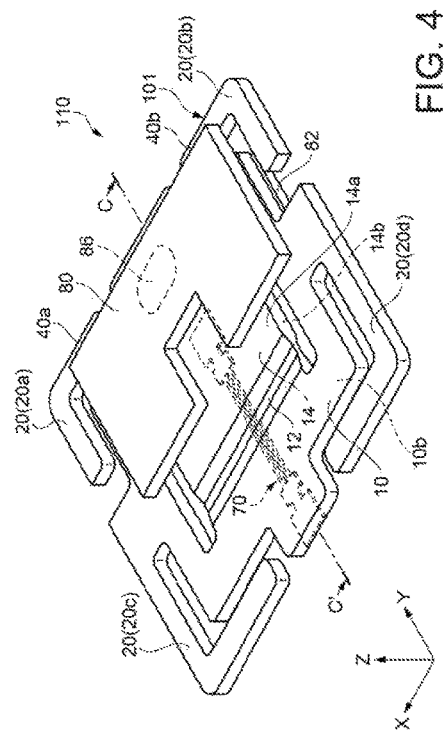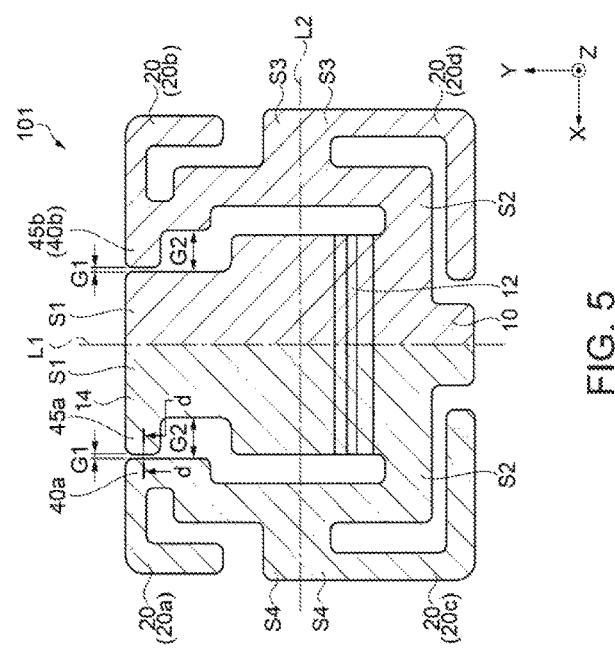

SUBSTRATE FOR SENSOR, PHYSICAL QUANTITY DETECTION SENSOR, ACCELERATION SENSOR, ELECTRONIC APPARATUS, VEHICLE, AND METHOD OF MANUFACTURING SUBSTRATE FOR SENSOR

This application claims the benefit of Japanese Application No. JP-2016-174308 filed Sep. 7, 2016. The disclosure of the prior application is hereby incorporated by reference herein in its entirety.

BACKGROUND

1. Technical Field

The present invention relates to a substrate for a sensor, a physical quantity detection sensor, an acceleration sensor, an electronic apparatus, a vehicle, and a method of manufacturing a substrate for a sensor.

2. Related Art

In the related art, for example, as described in JP-A-2012-189480, a physical quantity detection sensor is known in which a physical quantity detection element for detecting a physical quantity is fixed to a substrate for a sensor (a cantilever section) having a base section (a fixing section), a movable section connected to the base section, and a support portion extending along the movable section from the base section when viewed in a planar view as viewed from a thickness direction of the movable section. In the physical quantity detection sensor, the physical quantity detection element is fixed, at one end thereof, to the base section and fixed, at the other end thereof, to the movable section. Further, the physical quantity detection sensor is provided with a mass section disposed on at least one of both main surfaces of the movable section and disposed so as to partially overlap the support portion when viewed in the planar view.

In the physical quantity detection sensor having such a configuration, in a case where impact exceeding a design value is applied thereto, or the like, if the displacement of the movable section is increased beyond the design value, the movable section comes into contact with an undesirable place, or excessive stress is applied to a connection portion between the movable section and the base section, whereby there is a concern that the substrate for a sensor or the physical quantity detection element may be broken. In order to avoid this problem, the physical quantity detection sensor of JP-A-2012-189480 has a configuration in which a predetermined gap is provided between the mass section and the support portion at an area where the mass section and the support portion overlap, when viewed in a planar view as viewed from a thickness direction of the substrate for a sensor. Due to this configuration, when a relatively large physical quantity (for example, acceleration) in a thickness direction (a Z direction) is applied to the physical quantity detection sensor, the displacement of the movable section which is displaced according to acceleration can be restricted due to the mass section disposed on the main surface of the movable section coming into contact with the support portion when the mass section has been displaced by an amount corresponding to the predetermined gap.

Further, in JP-A-2000-338124, there is introduced a physical quantity detection sensor (a semiconductor acceleration sensor) in which at a portion of the inner peripheral surface of a support portion extending along a movable section from a base section when viewed in a planar view as viewed from a thickness direction of the movable section, a protrusion portion (a stopper portion) which makes the distance between the inner peripheral surface of the support portion and the movable section (a weight section) smaller than at other sites is provided to protrude. Due to this configuration, when a relatively large physical quantity in a direction intersecting a thickness direction (an in-plane direction of the movable section and the support portion) is applied to the physical quantity detection sensor, the displacement of the movable section (the weight section) which is displaced according to the physical quantity is restricted by the protrusion portion provided to protrude on the inner peripheral surface of the support portion, whereby excessive displacement of the movable section (the weight section) is restricted, and thus it is possible to prevent breakage of a substrate for a sensor or a physical quantity detection element.

In the physical quantity detection sensors of JP-A-2012-189480 and JP-A-2000-338124 described above, the substrate for a sensor having the base section, the movable section, and the support portion is integrally formed by etching a single crystal material such as quartz crystal or silicon.

Incidentally, in the quartz crystal which is suitably used as a material for forming the substrate for a sensor of the physical quantity detection sensor, it is known that a crystal has a diamond structure and when forming the outer shape of the substrate for a sensor by wet etching, because of an etching anisotropy due to a difference in etching rate in the respective crystal axis directions of the quartz crystal, it is difficult to accurately form a gap in the in-plane direction between the movable section and the support portion at a desired length. However, in JP-A-2000-338124, a method or the like of accurately forming a gap between the movable section and the protrusion portion on the inner peripheral surface of the support portion in consideration of the etching anisotropy of the quartz crystal described above is not described at all. For this reason, in a case where the gap between the movable section and the protrusion portion (a restricting portion or a stopper portion) becomes longer than a predetermined length, there is a concern that the substrate for a sensor or the physical quantity detection element may be broken in a case where impact exceeding the design value is applied to the physical quantity detection sensor. Further, in a case where the gap between the movable section and the protrusion portion (the restricting portion) becomes shorter than an appropriate length, the displacement range of the movable section is restricted to be smaller than in the setting, and therefore, there is a concern that the set detection range of a physical quantity such as acceleration may not be able to be satisfied.

SUMMARY

An advantage of some aspects of the invention is to solve at least a part of the problems described above, and the invention can be implemented as the following forms or application examples.

Application Example 1

A substrate for a sensor according to this application example includes: a base section; a movable section connected to the base section; a support portion which extends along the movable section from the base section when viewed in a planar view as viewed from a thickness direction of the movable section; and a gap portion formed to have a predetermined gap between the movable section and the support portion when viewed in the planar view, in which a ridge portion formed as an etching residue having a top portion on the side facing the gap portion is provided on each of facing surfaces of the movable section and the support portion in the gap portion, and the predetermined gap is a gap between a top portion of a first ridge portion which is the ridge portion formed at one of the movable section and the support portion, and a top portion of a second ridge portion which is the ridge portion formed at the other of the movable section and the support portion.

In the invention, in the substrate for a sensor, a portion in which a predetermined gap between the movable section and the support portion is accurately formed is referred to as a "gap portion".

Further, in this application example, the "ridge portion" is the shape of an etched surface which is formed due to an "etching anisotropy" which is a property when wet-etching a single crystal material such as quartz crystal which is suitably used as a material for forming the substrate for a sensor. Specifically, the "ridge portion" refers to a fin-shaped variant portion which is formed as an etching residue due to an etching anisotropy in which etching rates in the respective crystal axis directions of quartz crystal are different, when forming the outer shape of the substrate for a sensor by wet-etching, for example, quartz crystal with an alkaline aqueous solution such as potassium hydroxide (KOH), and is sometimes referred to as a "fin".

According to this application example, the gap portion having a predetermined gap is formed between the movable section and the support portion extending along the movable section from the base section, and the ridge portion having a top portion protruding as an etching residue is formed on each of the facing surfaces of the movable section and the support portion in the gap portion. The inventors of the invention have found that the shape of each of the ridge portions facing each other can be formed to be controlled to a desired shape by making an opening width of an etching mask a predetermined width when forming the gap portion having such a configuration by wet etching. In this regard, it becomes possible to accurately form the gap of the gap portion.

With this configuration, it is possible to realize a structure in which when impact in an in-plane direction of the movable section and the support portion is applied, in a case where the movable section is excessively displaced, the movable section is appropriately restricted by the support portion in the gap portion in which a predetermined gap is accurately formed, and therefore, it becomes possible to prevent excessive deformation of the substrate for a sensor or breakage thereof due to the excessive deformation. Therefore, it is possible to provide a substrate for a sensor capable of configuring a physical quantity detection sensor having high impact resistance and high detection accuracy.

Application Example 2

In the substrate for a sensor according to the application example, the support portions are respectively disposed on both sides in an extension direction of the movable section when viewed in the planar view, and the gap portions are respectively formed on both sides in the extension direction of the movable section.

According to this application example, a structure in which excessive displacement of the movable section is appropriately restricted by the support portion even in a case where impact is applied from either of both sides in the extension direction of the movable section when viewed in the planar view can be realized, and thus it becomes possible to prevent excessive deformation of the movable section of the substrate for a sensor or breakage thereof due to the excessive deformation.

Application Example 3

In the substrate for a sensor according to the application example, in the gap portion, when an opening width in the same direction as the predetermined gap, of a first opening portion which is an opening portion on the first surface side of the substrate for a sensor, is set to be W1, an opening width in the same direction as the predetermined gap, of a second opening portion which is an opening portion on the side of a second surface on the side opposite to the first surface of the substrate for a sensor, is set to be W2, and the predetermined gap is set to be Wg, the relationship of Wg<W1<W2 is established.

The inventors have found that when forming the substrate for a sensor by wet-etching a single crystal material such as quartz crystal, by forming the shape having the relationship Wg<W1<W2 in this application example by controlling the width of a pattern opening of an etching resist, the predetermined gap Wg of the gap portion which is a gap between the first ridge portion and the second ridge portion which are formed due to an etching anisotropy of a single crystal material can be formed with high accuracy and with ease in manufacturing difficulty.

With this configuration, it is possible to realize a structure in which excessive displacement of the movable section is appropriately restricted with the support portion in a case where impact is applied to the movable section, and therefore, it is possible to obtain a substrate for a sensor in which it is possible to prevent excessive deformation of the substrate for a sensor or breakage thereof due to the excessive deformation.

Application Example 4

In the substrate for a sensor according to the application example, at least one of a first inner wall surface which is formed from the top portion of the first ridge portion to the first surface side and a second inner wall surface which is formed from the top portion of the second ridge portion to the first surface side includes a plurality of surfaces, and at least one of a third inner wall surface which is formed from the top portion of the first ridge portion to the second surface side and a fourth inner wall surface which is formed from the top portion of the second ridge portion to the second surface side includes a plurality of surfaces.

The inventors have found that when forming the substrate for a sensor by wet-etching a single crystal material such as quartz crystal, by controlling the width of the pattern opening of the etching resist, the first ridge portion and the second ridge portion are formed due to an etching anisotropy of a single crystal material and the predetermined gap Wg of the gap portion which is a gap between the top portions of the respective ridge portions can be accurately formed. Therefore, it is possible to realize a structure in which excessive displacement of the movable section is restricted with the support portion in a case where impact is applied to the movable section, and therefore, it is possible to prevent excessive deformation of the substrate for a sensor or breakage thereof due to the excessive deformation.

Application Example 5

In the substrate for a sensor according to the application example, one inner wall surface combination out of a combination of the first inner wall surface and the second inner wall surface and a combination of the third inner wall surface and the fourth inner wall surface in the gap portion is one inner wall surface combination among a first inner wall surface combination in which an inner wall surface on one side includes three surfaces and an inner wall surface on the other side includes a single surface, a second inner wall surface combination in which an inner wall surface on one side includes three surfaces and an inner wall surface on the other side includes two surfaces, and a third inner wall surface combination in which an inner wall surface on one side includes four surfaces, an inner wall surface on the other side includes three surfaces, and first surfaces from the top portions, of the inner wall surface on one side and the inner wall surface on the other side, are surfaces substantially parallel to the first surface or the second surface.

The inventors have found that when forming the substrate for a sensor by wet-etching a single crystal material such as quartz crystal, by controlling the width of the pattern opening of the etching resist, it is possible to form recessed portions of the inner wall surface combinations having three types of shapes shown in this application example due to an etching anisotropy of a single crystal material, and it is possible to form the first ridge portion and the second ridge portion with a high accuracy of the predetermined gap Wg of the gap portion by forming two recessed portions among the three types from both sides; the first surface side of the single crystal material and the side of the second surface on the side opposite to the first surface side and penetrating the respective recess bottom portions.

Application Example 6

In the substrate for a sensor according to the application example, the second surface side is the third inner wall surface combination, and the first surface side is the first inner wall surface combination.

In this application example, the third inner wall surface combination having an opening portion (the second opening portion) on the second surface side is formed such that the opening width is the largest among the three types of inner wall surface combinations, and an etching rate is the fastest, and the first inner wall surface combination having an opening portion (the first opening portion) on the first surface side is formed such that the opening width is the smallest among the three types of inner wall surface combinations, an etching rate is the slowest, and thus etching shape forming accuracy is the highest.

According to the inner wall surface combinations of this application example, when forming the substrate for a sensor by wet-etching a single crystal material such as quartz crystal, by first forming a recessed portion by the third inner wall surface combination having a larger opening width from the second surface side, then forming a recessed portion by the first inner wall surface combination having a smaller opening width from the first surface side, and penetrating the recess bottom portions of the respective recessed portions, it is possible to form the first ridge portion and the second ridge portion in a state where the accuracy of the predetermined gap Wg of the gap portion is further enhanced.

Further, in the third inner wall surface combination for first forming a recessed portion from the second surface side, the first surfaces from the top portions are surfaces substantially parallel to the second surface, and therefore, the range of the position where the recessed portion of the first inner wall surface combination is formed from the first surface side and then penetrated to the recessed portion formed from the second surface side becomes relatively wide. In this way, the allowable range of the formation position of the opening of the etching resist for forming the first inner wall surface combination on the first surface side can be widened, and therefore, a decrease in yield due to so-called "mask misalignment" in which the patterning positions of the etching resists which are formed on the first surface side and the second surface side are deviated from each other can be reduced, and thus the effect of increasing a manufacturing margin is obtained.

Application Example 7

In the substrate for a sensor according to the application example, the second surface side is the third inner wall surface combination, and the first surface side is the second inner wall surface combination.

In this application example, the second inner wall surface combination having an opening portion (the second opening portion) on the first surface side has an opening width intermediate between that of the first inner wall surface combination and that of the third inner wall surface combination. Therefore, according to the inner wall surface combinations of this application example, when forming the substrate for a sensor by wet-etching a single crystal material such as quartz crystal, by first forming a recessed portion by the third inner wall surface combination having a larger opening portion from the second surface side, then forming a recessed portion by the second inner wall surface combination having a smaller opening portion from the first surface side, and penetrating the recess bottom portions of the respective recessed portions, it is possible to form the first ridge portion and the second ridge portion in which the accuracy of the predetermined gap Wg of the gap portion is good.

Application Example 8

In the substrate for a sensor according to the application example, the second surface side is the second inner wall surface combination, and the first surface side is the first inner wall surface combination.

According to the inner wall surface combinations of this application example, when forming the substrate for a sensor by wet-etching a single crystal material such as quartz crystal, by first forming a recessed portion by the second inner wall surface combination having a larger opening portion from the second surface side, then forming a recessed portion by the first inner wall surface combination having a smaller opening portion from the first surface side, and penetrating the recess bottom portions of the respective recessed portions, it is possible to accurately form the predetermined gap Wg of the gap portion which is a gap between the first ridge portion and the second ridge portion.

Application Example 9

In the substrate for a sensor according to the application example, the substrate for a sensor is formed using a quartz crystal Z-cut plate cut out in a Z-cut, and the top portion of one of the first ridge portion and the second ridge portion protrudes in an X crystal axis direction of the quartz crystal Z-cut plate.

According to this application example, the quartz crystal that is a material for forming the substrate for a sensor is formed from a Z-cut quartz crystal substrate (a quartz crystal Z-cut plate) having an X-axis called an electrical axis, a Y-axis called a mechanical axis, and a Z-axis called an optical axis and processed in a flat plate shape by being cut out along a plane which is defined by the X-axis and the Y-axis orthogonal to each other in quartz crystal axes, from raw ore (Lambert) or the like. In the quartz crystal Z-cut plate, etching is relatively easy due to its characteristics, and therefore, it is possible to accurately form the outer shape of the substrate for a sensor, such as the first ridge portion and the second ridge portion, or the gap portion having a predetermined gap which is a gap between the first ridge portion and the second ridge portion.

Further, a cut-out angle in the thickness direction of the substrate for a sensor and a cut-out angle in the thickness direction of a detection element (a sensor) such as a physical quantity detection element, for example, which is mounted on the substrate for a sensor, are made to be the same Z-cut, whereby it is possible to approximate linear expansion coefficients (coefficients of thermal expansion) to each other. A material having approximated linear expansion coefficients is used, whereby the thermal stress between the substrate for a sensor and the detection element due to an ambient temperature change thereof is suppressed, and thus it becomes possible to provide a physical quantity detection sensor capable of performing physical quantity measurement having high detection accuracy with thermal stress suppressed.

Application Example 10

A physical quantity detection sensor according to this application example includes: the substrate for a sensor according to the application example; and a physical quantity detection element which has one end portion fixed to the base section and the other end portion fixed to the movable section and detects a physical quantity.

According to this application example, the physical quantity detection sensor is provided with the substrate for a sensor according to the above application example and one end portion and the other end portion of the physical quantity detection element are respectively fixed to the base section and the movable section of the substrate for a sensor. Therefore, even in a case where impact is applied, excessive deformation of the physical quantity detection element or the substrate for a sensor or breakage thereof due to the excessive deformation is prevented, and thus it is possible to provide a physical quantity detection sensor having high impact resistance and high detection accuracy.

Application Example 11

An acceleration sensor according to this application example includes: the physical quantity detection sensor according to the application example, in which acceleration is measured by the physical quantity detection sensor.

According to this application example, the acceleration sensor is provided with the physical quantity detection sensor according to the above application example, and therefore, impact resistance is high, and the movable section performs exact displacement according to a physical quantity applied thereto, whereby it is possible to accurately detect the physical quantity. In the acceleration sensor equipped with such a physical quantity detection sensor, improvement in the reliability of the measured acceleration can be attained.

Application Example 12

An electronic apparatus according to this application example includes: the physical quantity detection sensor according to the application example.

The electronic apparatus according to this application example is equipped with the physical quantity detection sensor according to the above application example. The physical quantity detection sensor has high impact resistance and can accurately detect a physical quantity applied thereto. In the electronic apparatus equipped with such a physical quantity detection sensor, improvement in characteristics and reliability of equipment can be attained.

Application Example 13

A vehicle according to this application example includes: the physical quantity detection sensor according to the above application example.

The vehicle according to this application example is equipped with the physical quantity detection sensor according to the above application example, and therefore, impact resistance is high, and it is possible to accurately detect a physical quantity applied thereto. In the vehicle equipped with such a physical quantity detection sensor, grasp of a movement state, an attitude, or the like can be reliably performed by the detecting function of the physical quantity detection sensor, and thus it is possible to perform safe and stable movement.

Application Example 14

A method of manufacturing a substrate for a sensor according to this application example is a method of manufacturing a substrate for a sensor which includes a base section, a movable section connected to the base section, a support portion which extends along the movable section from the base section when viewed in a planar view as viewed from a thickness direction of the movable section, and a gap portion formed to have a predetermined gap between the movable section and the support portion when viewed in the planar view, and in which a ridge portion formed as an etching residue having a top portion on the side facing the gap portion is provided on each of facing surfaces of the movable section and the support portion in the gap portion, and the predetermined gap is a gap between a top portion of a first ridge portion which is the ridge portion formed at one of the movable section and the support portion, and a top portion of a second ridge portion which is the ridge portion formed at the other of the movable section and the support portion, the method including: forming corrosion-resistant films on surfaces of a substrate forming material; forming a first pattern opening by forming photoresist layers on the corrosion-resistant films, patterning the photoresist layer on the side of a second surface on one side of the surfaces, and removing the exposed corrosion-resistant film to expose a part of the surface of the substrate forming material; performing first etching of forming a first recessed portion in the substrate forming material by wet-etching the surface of the substrate forming material exposed in the first pattern opening; covering at least an inner surface of the first recessed portion with a protective film; forming a second pattern opening by patterning the photoresist layer on the corrosion-resistant film on the side of a first surface on the side opposite to the second surface and removing the exposed corrosion-resistant film to expose a part of the surface of the substrate forming material; and performing second etching of forming the gap portion by penetrating a recess bottom portion of a second recessed portion which is formed by wet-etching the surface of the substrate forming material exposed in the second pattern opening, to the first recessed portion, in which when a width in the same direction as the predetermined gap, of each of the first pattern opening and the second pattern opening, is set to be Wp, an etching depth of the substrate forming material in the first etching or the second etching is set to be d, and a limit value of the amount of displacement of the movable section is set to be Wgmax, the relationship of one of the following Expressions (1) to (3) is satisfied.

$$0 < Wp \leq 0.7735d+0.5 \quad (1)$$

$$0.7735d+0.5 \leq Wp \leq 1.9393d+0.2083 \quad (2)$$

$$1.9393d+0.2083 \leq Wp \leq Wg\text{max}+1.956d \quad (3)$$

In this application example, the limit value Wgmax of the amount of displacement of the movable section refers to a limit value of the amount of displacement, at which breakage or the like of the movable section can occur if, in the amount of displacement of the movable section when impact is applied thereto from the outside, the amount of displacement is exceeded.

The inventors have found that in the manufacturing method of this application example in which a gap portion is formed by forming the first recessed portion by wet-etching the second surface side of a single crystal material and then penetrating a recess bottom portion of a second recessed portion which is formed by wet-etching the first surface side on the side opposite to the second surface side, to the first recessed portion, by forming corrosion-resistant film patterns having the widths Wp of the first pattern opening and the second pattern opening determined by substituting the etching depth d necessary for forming each recessed portion into one of Expressions (1) to (3), and performing wet etching using them as etching masks, it becomes possible to accurately form the predetermined gap Wg of the gap portion which includes the first ridge portion and the second ridge portion.

According to the method of manufacturing a substrate for a sensor of this application example, a structure in which when impact in an in-plane direction of the movable section and the support portion is applied, in a case where the movable section is excessively displaced, the movable section is appropriately restricted by the support portion in the gap portion in which a predetermined gap is accurately formed can be realized, and therefore, it becomes possible to prevent excessive deformation of the substrate for a sensor or breakage thereof due to the excessive deformation. Therefore, it is possible to manufacture a substrate for a sensor capable of configuring a physical quantity detection sensor having high impact resistance and high detection accuracy.

Application Example 15

In the method of manufacturing a substrate for a sensor according to the application example, the width Wp of the first pattern opening may have the relationship of Expression (4), and the width Wp of the second pattern opening have the relationship of Expression (5).

$$1.9393d+0.2083 \leq Wp \leq Wg\text{max}+1.956d \quad (4)$$

$$0 < Wp \leq 0.7735d+0.5 \quad (5)$$

In this application example, in the shape of the first recessed portion which is formed by wet-etching the second surface by using the mask pattern having the width Wp of the first pattern opening which is calculated by Expression (4) as an etching resist, the width of an opening portion (the second opening portion) which is formed is the largest among the pattern openings which are calculated by the three expressions of the above application example, the shape of the first recessed portion is formed as a recessed portion having the third inner wall surface combination in the above application example, and an etching rate is the fastest. Further, in the shape of the second recessed portion which is formed by wet-etching the first surface by using the mask pattern having the width Wp of the second pattern opening which is calculated by Expression (5) as an etching resist, the width of an opening portion (the first opening portion) which is formed is the smallest among the pattern openings which are calculated by the three expressions of the above application example, the shape of the second recessed portion is formed as a recessed portion having the first inner wall surface combination in the above application example, and an etching rate is the slowest, and thus etching shape forming accuracy is the highest.

According to the combination of the pattern openings of this application example, when forming the substrate for a sensor by wet-etching a single crystal material such as quartz crystal, by first forming a recessed portion by the third inner wall surface combination having a larger opening portion from the second surface side, then forming a recessed portion by the first inner wall surface combination having a smaller opening portion from the first surface side, and penetrating the recess bottom portions of the respective recessed portions, it is possible to form the first ridge portion and the second ridge portion in a state where the accuracy of the predetermined gap Wg of the gap portion is further enhanced.

Further, according to the width Wp of the first pattern opening which is calculated by Expression (4) for first forming the first recessed portion from the second surface side, the surface substantially parallel to the second surface side, of a recess bottom portion (a bottom surface) of the first recessed portion which is formed, is formed to be the largest among the recessed portions which are formed by the three expressions described above, and therefore, the range of the position where the second recessed portion according to Expression (5) is formed from the first surface side and the recess bottom portion thereof is penetrated to the first recessed portion becomes relatively wide. In this way, a decrease in yield due to so-called "mask misalignment" in which deviation occurs in the positional relationship between the etching resist pattern which is formed on the second surface side and the etching resist pattern which is formed on the first surface side can be reduced, and thus the effect of increasing a manufacturing margin is obtained.

Application Example 16

In the method of manufacturing a substrate for a sensor according to the application example, the width Wp of the first pattern opening has the relationship of Expression (6), and the width Wp of the second pattern opening has the relationship of Expression (7).

$$1.9393d+0.2083 \leq Wp \leq Wg\text{max}+1.956d \quad (6)$$

$$0.7735d+0.5 \leq Wp \leq 1.9393d+0.2083 \quad (7)$$

In this application example, in the shape of the first recessed portion which is formed by wet-etching the second surface by using the mask pattern having the width Wp of the first pattern opening which is calculated by Expression (6) as an etching resist, the width of an opening portion (the second opening portion) which is formed is the largest among the pattern openings which are calculated by the three expressions of the above application example, the shape of the first recessed portion is formed as a recessed portion having the third inner wall surface combination in the above application example, and an etching rate is the fastest. Further, in the shape of the second recessed portion which is formed by wet-etching the first surface by using the mask pattern having the width Wp of the second pattern opening which is calculated by Expression (7) as an etching resist, the width of an opening portion (the first opening portion) which is formed has a width intermediate between those by the other two expressions, among the pattern openings which are calculated by the three expressions of the above application example, the shape of the second recessed portion is formed as a recessed portion having the second inner wall surface combination in the above application example, and an etching rate and etching shape forming accuracy are positioned between those by the other two expressions.

According to the combination of the pattern openings of this application example, by first forming a recessed portion by the third inner wall surface combination having a larger opening portion from the second surface side, then forming a recessed portion by the second inner wall surface combination having a smaller opening portion from the first surface side, and penetrating the recess bottom portions of the respective recessed portions, it is possible to form the first ridge portion and the second ridge portion in a state where the accuracy of the predetermined gap Wg of the gap portion is enhanced, and an etching rate is faster than in the configuration using the recessed portion by the first inner wall surface combination of the above application example. Therefore, an effect that the manufacturing efficiency is good is obtained.

Application Example 17

In the method of manufacturing a substrate for a sensor according to the application example, the width Wp of the first pattern opening has the relationship of Expression (8), and the width Wp of the second pattern opening has the relationship of Expression (9).

$$1.9393d+0.2083 \leq Wp \leq Wg\text{max}+1.956d \quad (8)$$

$$0 < Wp \leq 0.7735d+0.5 \quad (9)$$

In this application example, the shape of the first recessed portion which is formed by wet-etching the second surface by using the mask pattern having the width Wp of the first pattern opening which is calculated by Expression (8) as an etching resist is formed as a recessed portion having the second inner wall surface combination in the above application example, and the opening width of an opening portion (the second opening portion) is wider than the opening width of an opening portion (the first opening portion) of the second recessed portion having the first inner wall surface combination which is formed by wet-etching the first surface by using the mask pattern having the width Wp of the second pattern opening which is calculated by Expression (9) as an etching resist. Therefore, according to the combination of the pattern openings of this application example, by first forming a recessed portion by the second inner wall surface combination having a larger opening portion from the second surface side, then forming a recessed portion by the first inner wall surface combination having a smaller opening portion from the first surface side, and penetrating the recess bottom portions of the respective recessed portions, it is possible to form the first ridge portion and the second ridge portion in a state where the accuracy of the predetermined gap Wg of the gap portion is enhanced, and it becomes possible to accurately form the gap portion in a shorter time than in the formation of the gap portion by the third inner wall surface combination and the first inner wall surface combination of the above application example.

BRIEF DESCRIPTION OF THE DRAWINGS

The invention will be described with reference to the accompanying drawings, wherein like numbers reference like elements.

FIG. 4 is a perspective view showing a physical quantity detection device with which the physical quantity detection sensor of FIG. 1 is provided.

FIG. 5 is a plan view of a cantilever section as a substrate for a sensor with which the physical quantity detection sensor is provided.

DESCRIPTION OF EXEMPLARY EMBODIMENTS

Hereinafter, embodiments of the invention will be described with reference to the drawings. In each of the following drawings, in order to show each layer or each member in a recognizable size, there is a case where each layer or each member is shown on a scale different from the actual size.

Embodiment 1

Physical Quantity Detection Sensor

Hereinafter, a physical quantity detection sensor according to Embodiment 1 will be described using FIGS. 1 and 3.

Figure 1:
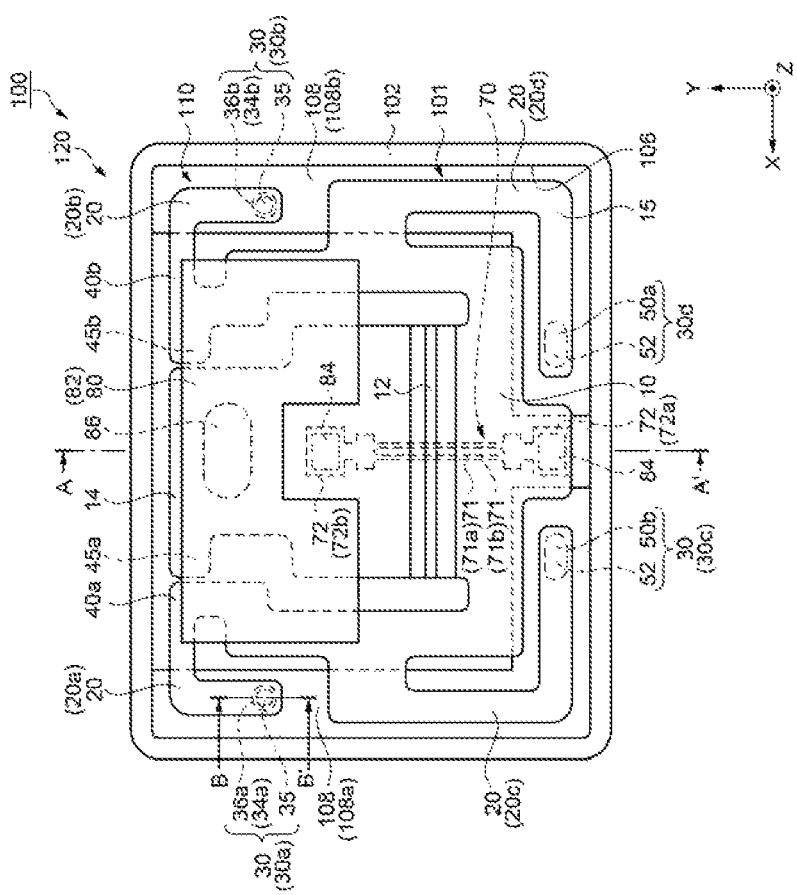
FIG. 1 is a plan view of a physical quantity detection sensor according to Embodiment 1.

FIG. 1 is a plan view showing the configuration of a physical quantity detection sensor 100 according to this embodiment. FIG. 3 is a cross-sectional view showing the configuration of the physical quantity detection sensor 100 and is a cross-sectional view of a portion indicated by line segment A-A' in FIG. 1. In FIGS. 1 and 3, as three axes orthogonal to each other, an X-axis, a Y-axis, and a Z-axis are shown. The Z-axis is an axis indicating a direction in which the gravity acts.

Further, for convenience of description, illustration of a lid 103 is omitted in FIG. 1.

In this embodiment, description will be made with seeing the physical quantity detection sensor 100 from a Z-axis direction regarded as being viewed in a planar view.

Figure 3:
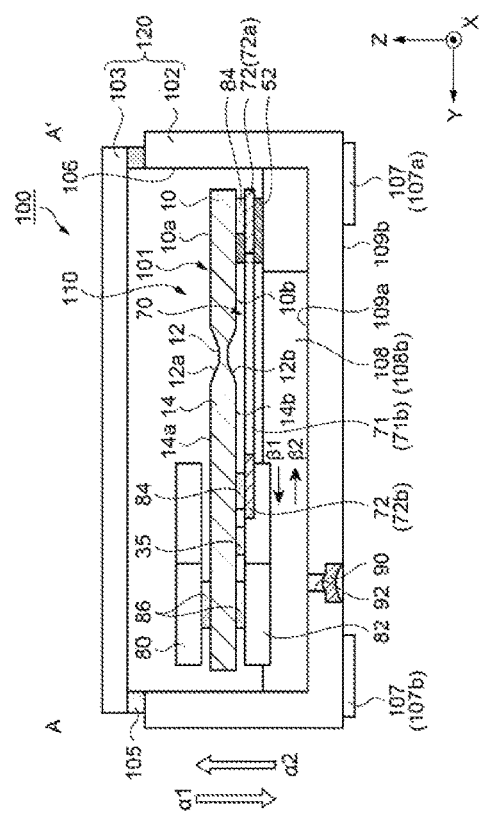
FIG. 3 is a cross-sectional view taken along line segment A-A' of FIG. 1.

The physical quantity detection sensor 100 has a physical quantity detection device 110 and a package 120, as shown in FIGS. 1 and 3. Further, the package 120 has a base substrate 102 and the lid 103.

The base substrate 102 has a recessed portion 106, and the physical quantity detection device 110 is accommodated in the recessed portion 106. The shape of the base substrate 102 is not particularly limited as long as it is possible to accommodate the physical quantity detection device 110 in the recessed portion 106.

In this embodiment, the base substrate 102 is formed of a material having a coefficient of thermal expansion which coincides with or is as close as possible to the coefficient of thermal expansion of a cantilever section 101 as a substrate for a sensor or the lid 103, and in this example, ceramic is used. However, there is no limitation thereto, and a material such as quartz crystal, glass, or silicon may be used.

The base substrate 102 in this embodiment has an inner bottom surface 109a that is a bottom surface on the inside of the recessed portion 106, and step portions 108 (108a and 108b) which protrude toward the lid 103 side from the inner bottom surface 109a.

The step portions 108a and 108b are provided in order to fix the physical quantity detection device 110 (described later) to the base substrate 102 and are each provided, for example, in an approximately L-shape along two directions of the inner wall of the recessed portion 106. Specifically, the step portion 108a is continuously provided to have a predetermined width along the inner wall in a +X-axis direction and the inner wall in a −Y-axis direction of the recessed portion 106 when viewed in a planar view. The step portion 108b is continuously provided to have a predetermined width along the inner wall in a −X-axis direction and the inner wall in the −Y-axis direction of the recessed portion 106 when viewed in a planar view.

Further, when viewed in a planar view, an internal terminal 34a which is included in a first fixing section 30a (described later) is provided on the surface in a +Z-axis direction of the step portion 108a and an internal terminal 34b which is included in a first fixing section 30b (described later) is provided on the surface in the +Z-axis direction of the step portion 108b.

External terminals 107 (107a and 107b) which are used when being mounted on an external member are provided on an outer bottom surface 109b that is the surface on the side opposite to the inner bottom surface 109a of the base substrate 102. The external terminals 107 are electrically connected to the internal terminals 34a and 34b through internal wirings (not shown). For example, the external terminal 107a is electrically connected to the internal terminal 34a and the external terminal 107b is electrically connected to the internal terminal 34b.

Each of the internal terminals 34a and 34b and the external terminals 107a and 107b is configured with, for example, a metal film formed by coating and laminating a thin film such as nickel (Ni) or gold (Au) on a metallization layer such as tungsten (W) by a method such as plating.

A through-hole 92 penetrating from the outer bottom surface 109b to the inner bottom surface 109a is provided in the base substrate 102, and a sealing section 90 for sealing the inside (the cavity) of the package 120 is provided in the through-hole 92 formed in the base substrate 102. In the example shown in FIG. 3, the through-hole 92 has a stepped shape in which the hole diameter on the outer bottom surface 109b side is larger than the hole diameter on the inner bottom surface 109a side. The sealing section 90 can be provided by disposing a sealing material made of, for example, an alloy of gold (Au) and germanium (Ge), solder, or the like in the through-hole 92, heating and melting the sealing material, and then solidifying it. The sealing section 90 is provided in order to air-tightly seal the inside of the package 120.

The lid 103 is provided so as to cover the recessed portion 106 of the base substrate 102. The shape of the lid 103 is, for example, a plate shape. As the lid 103, the same material as that of the base substrate 102, metal such as Kovar or stainless steel, or the like is used. The lid 103 is joined to the base substrate 102 through a lid jointing material 105. As the lid jointing material 105, for example, a sealing ring, low-melting-point glass, an inorganic adhesive, or the like may be used.

The inside of the package 120 is sealed after the joining of the base substrate 102 and the lid 103. The inside of the package 120 is depressurized by removing air in the recessed portion 106 from the through-hole 92 and sealed by a method of closing the through-hole 92 with the sealing section 90 such as a sealing material, and thereby, the physical quantity detection device 110 is mounted in the recessed portion 106 which is in a depressurized and airtight state. The inside of the recessed portion 106 may be filled with an inert gas such as nitrogen, helium, or argon. Further, a configuration is also acceptable in which the lid 103 is formed in a recessed shape and the base substrate 102 may be a flat plate.

Physical Quantity Detection Device

Figure 2:
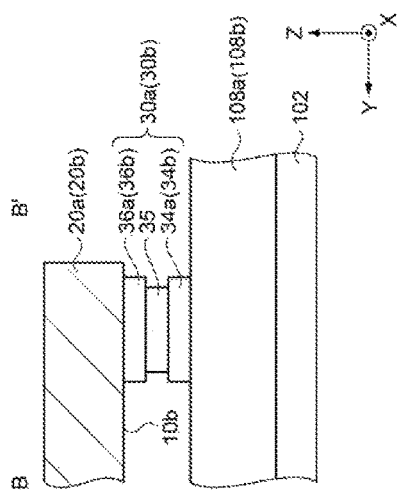
FIG. 2 is a partial cross-sectional view taken along line segment B-B' of FIG. 1.

Next, the physical quantity detection device 110 will be described using FIGS. 1 to 6. FIG. 2 is an enlarged cross-sectional view of a portion shown by line segment B-B' in FIG. 1. FIG. 4 is a perspective view showing the configuration of the physical quantity detection device 110 with which the physical quantity detection sensor 100 of FIG. 1 is provided. FIG. 5 is a plan view showing the cantilever section 101 as the substrate for a sensor with which the physical quantity detection device 110 is provided.

Figure 6:
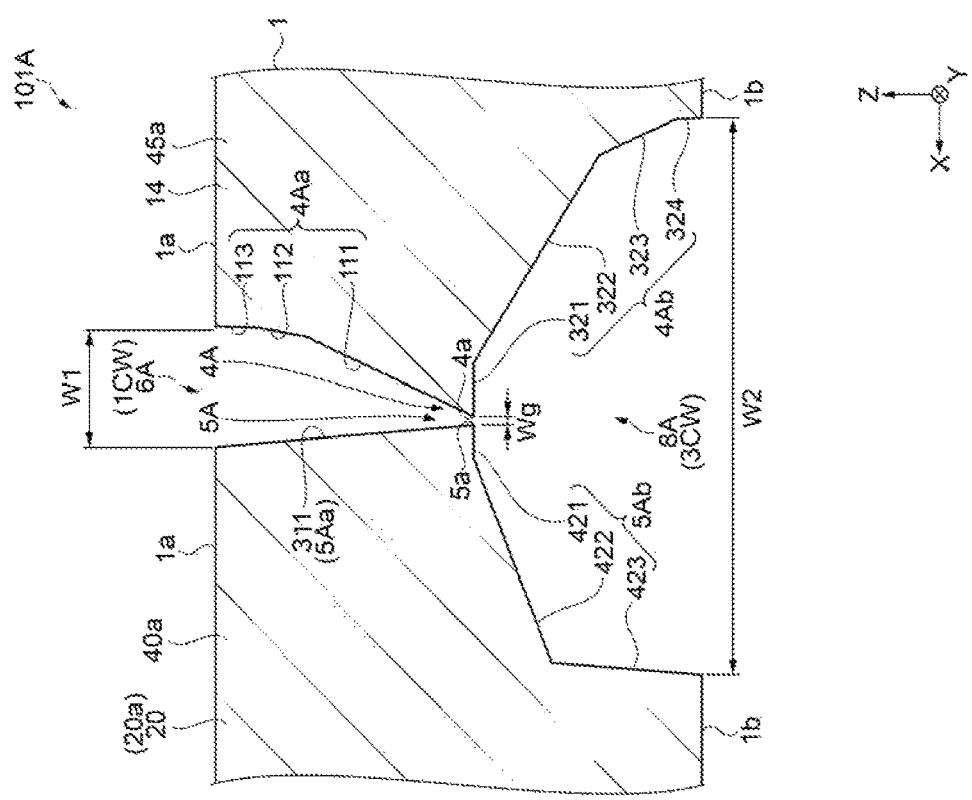
FIG. 6 is a partial cross-sectional view taken along line segment d-d of FIG. 5.

FIG. 6 is a partial cross-sectional view taken along line segment d-d of FIG. 5.

Further, in FIGS. 2, and 4 to 6, as three axes orthogonal to each other, the X-axis, the Y-axis, and the Z-axis are shown. The Z-axis is an axis indicating a direction in which the gravity acts.

The physical quantity detection device 110 has the cantilever section 101 as the substrate for a sensor fixed to the base substrate 102, a physical quantity detection element 70 which is fixed to the cantilever section 101 and detects a physical quantity, for example, acceleration, and mass sections 80 and 82 which are fixed to the cantilever section 101 and act as weights, as shown in FIGS. 3 and 4.

The physical quantity detection element 70 is disposed on the inner bottom surface 109a side of the cantilever section 101 and has one end portion fixed to a base section 10 and the other end portion fixed to a movable section 14.

First, the cantilever section 101 will be described using FIGS. 1, and 3 to 6.

The cantilever section 101 has the base section 10, a joint section 12, the movable section 14, arm portions 20 (20a, 20b, 20c, and 20d) as support portions, first fixing sections 30 (30a, 30b, 30c, and 30d), and protrusion portions 45a and 45b.

The base section 10 has a plate shape and has a void at a central portion when viewed in a planar view. The movable section 14 likewise having a plate shape is provided in the void, and the movable section 14 and the base section 10 are connected to each other through the joint section 12. The arm portions 20 (20a, 20b, 20c, and 20d) are provided at corner portions of the base section 10. Further, the base section 10 has main surfaces 10a and 10b (refer to FIG. 3) which are in the relationship of the front and the back opposite to each other. Specifically, the main surface 10a faces the lid 103 side with respect to the base section 10, and the main surface 10b faces the inner bottom surface 109a side with respect to the base section 10.

The joint section 12 is provided between the base section 10 and the movable section 14 and is connected to the base section 10 and the movable section 14. The thickness (the length in the Z-axis direction) of the joint section 12 is provided to be thinner (shorter) than the thickness of the base section 10 and the thickness of the movable section 14. For example, in the joint section 12, bottomed groove portions 12a and 12b (refer to FIG. 3) are formed by so-called half-etching treatment from main surfaces 14a and 14b (described later).

In this embodiment, the groove portions 12a and 12b are provided to extend along an X-axis direction. The joint section 12 becomes a rotary shaft along the X-axis direction as a supporting point (an intermediate hinge) when the movable section 14 is displaced (rotated) with respect to the base section 10.

The movable section 14 is provided to extend from the base section 10. Specifically, the movable section 14 is provided along a Y-axis direction through the joint section 12 from the base section 10. The movable section 14 has a shape that is a plate shape, and has the main surfaces 14a and 14b (refer to FIG. 3) which are in the relationship of the front and the back opposite to each other. Further, the main surface 14a faces the lid 103 side with respect to the movable section 14, and the main surface 14b faces the inner bottom surface 109a side with respect to the movable section 14.

The movable section 14 can be displaced in a direction (the Z-axis direction) intersecting the main surfaces 14a and 14b with the joint section 12 as a supporting point (a rotary shaft), according to a physical quantity, for example, acceleration $\alpha 1$ or $\alpha 2$ (refer to FIG. 3), which is applied in the direction (the Z-axis direction) intersecting the main surfaces 14a and 14b.

The mass sections 80 and 82 acting as weights are provided at the movable section 14. Specifically, the mass section 80 is provided on the main surface 14a through a mass jointing material 86, and the mass section 82 is provided on the main surface 14b through the mass jointing material 86 so as to overlap the mass section 80 when viewed in a planar view.

As the shape of each of the mass sections 80 and 82, it is suitable to use a shape which is a plate shape and in which a portion of a side on one side in a longitudinal direction when viewed in a planar view has a recess shape recessed toward the side of a facing side, as shown in FIG. 1, for example. The shape of each of the mass sections 80 and 82 is not limited to the above-described shape as long as the movable section 14 can perform predetermined motions.

As a material of each of the mass sections 80 and 82, it is suitable to use, for example, phosphor bronze (Cu—Sn—

P). The material of each of the mass sections 80 and 82 is not limited to phosphor bronze. For example, metal such as copper (Cu) or gold (Au) may be used. Further, as a material of the mass jointing material 86, for example, a thermosetting adhesive which includes epoxy resin or silicone resin may be used.

In this embodiment, the mass sections 80 and 82 are respectively provided one by one on the main surfaces 14a and 14b of the movable section 14. However, there is no limitation thereto, and one mass section or a plurality of mass sections 80 and 82 may be provided on either of the main surface 14a or the main surface 14b, and a plurality of mass sections 80 and 82 may be provided on each of the main surfaces 14a and 14b.

Here, the arm portions 20a, 20b, 20c, and 20d of the cantilever section 101 will be described. Each of the arm portions 20a, 20b, 20c, and 20d is provided with a predetermined width in an approximately L-shape when viewed in a planar view.

The arm portion 20a is provided to extend in the +X-axis direction from an end portion in the +Y direction of the base section 10 and then extend along the outer periphery of the base section 10 in the −Y-axis direction when viewed in a planar view. Here, the arm portion 20a as the support portion has a portion provided to extend along the movable section 14 toward the +X-axis direction from the end portion in the +Y direction of the base section 10 when viewed in a planar view as viewed from a thickness direction of the movable section 14.

The arm portion 20a has an installation area for the first fixing section 30a on the main surface 10b side of the position where the tip of the arm portion 20a and the step portion 108a overlap, when viewed in a planar view. The first fixing section 30a is configured to include a fixing section connection terminal 36a on the main surface 10b side, a jointing material 35, and the internal terminal 34a of the step portion 108a (refer to FIG. 2). Further, the fixing section connection terminal 36a is connected to the internal terminal 34a through the jointing material 35 so as to overlap the internal terminal 34a when viewed in a planar view.

In this way, the arm portion 20a (the cantilever section 101) is connected to the step portion 108a (the base substrate 102) through the first fixing section 30a.

The arm portion 20b is provided to extend in the −X-axis direction from an end portion in the +Y direction of the base section 10 and then extend along the outer periphery of the base section 10 in the −Y-axis direction when viewed in a planar view. Here, the arm portion 20b as the support portion has a portion provided to extend along the movable section 14 toward the −X-axis direction from the end portion in the +Y direction of the base section 10 when viewed in a planar view as viewed from the thickness direction of the movable section 14.

The arm portion 20b has an installation area for the first fixing section 30b on the main surface 10b side of the position where the tip of the arm portion 20b and the step portion 108b overlap, when viewed in a planar view. The first fixing section 30b is configured to include a fixing section connection terminal 36b on the main surface 10b side, the jointing material 35, and the internal terminal 34b of the step portion 108b (the configuration is substantially the same as that of FIG. 2, and therefore, refer to FIG. 2). Further, the fixing section connection terminal 36b is connected to the internal terminal 34b through the jointing material 35 so as to overlap the internal terminal 34b when viewed in a planar view.

In this way, the arm portion 20b (the cantilever section 101) is connected to the step portion 108b (the base substrate 102) through the first fixing section 30b.

As the jointing material 35, for example, an epoxy resin-based or silicone resin-based conductive adhesive or the like, which includes a conductive material such as a metal filler, may be used.

The arm portion 20c is provided to extend the −Y-axis direction from a substantially central portion of an end portion in the +X-axis direction of the base section 10 and then extend along the outer periphery of the base section 10 in the −X-axis direction when viewed in a planar view.

The arm portion 20c has a base joint portion 50b that is an installation area for a base jointing material 52 on the main surface 10b side of the position where the tip of the arm portion 20c and the step portion 108a overlap, when viewed in a planar view. The first fixing section 30c is configured to include the base jointing material 52 provided at the base joint portion 50b, and the base joint portion 50b.

In this way, the arm portion 20c (the cantilever section 101) is connected to the step portion 108a (the base substrate 102) through the first fixing section 30c.

The arm portion 20d is provided to extend the −Y-axis direction from a substantially central portion of an end portion in the −X-axis direction of the base section 10 and then extend along the outer periphery of the base section 10 in the +X-axis direction when viewed in a planar view.

The arm portion 20d has a base joint portion 50a that is an installation area for the base jointing material 52 on the main surface 10b side of the position where the tip of the arm portion 20d and the step portion 108b overlap, when viewed in a planar view. The first fixing section 30d is configured to include the base jointing material 52 provided at the base joint portion 50a, and the base joint portion 50a.

In this way, the arm portion 20d (the cantilever section 101) is connected to the step portion 108b (the base substrate 102) through the first fixing section 30d.

As the base jointing material 52, for example, epoxy resin or silicone resin is suitably used.

Here, the configurations of the arm portions 20 and the like of the cantilever section 101 will be described using FIG. 5.

In this description, description will be made using a first center line L1 passing through the centers of two base portions 72 of the physical quantity detection element 70 when viewed in a planar view, and a second center line L2 orthogonal to the first center line L1 and passing through the center of the cantilever section 101.

Further, for convenience of description, the +Y direction side of the first center line L1 of FIG. 5 is referred to as the "top", the −Y direction side of the first center line L1 is referred to as the "bottom", the +X direction side of the second center line L2 is referred to as the "left", and the −X direction side of the second center line L2 is referred to as the "right".

In the cantilever section 101, an area on the upper side with respect to the second center line L2 is set to be a first area S1, an area on the lower side with respect to the second center line L2 is set to be a second area S2, an area on the right side with respect to the first center line L1 is set to be a third area S3, and an area on the left side with respect to the first center line L1 is set to be a fourth area S4.

The arm portion 20a, the first fixing section 30a, the arm portion 20b, and the first fixing section 30b are provided in the first area S1, and the arm portion 20c, the first fixing section 30c, the arm portion 20d, and the first fixing section 30d are provided in the second area S2.

Further, the arm portion 20b, the first fixing section 30b, the arm portion 20d, and the first fixing section 30d are provided in the third area S3, and the arm portion 20a, the first fixing section 30a, the arm portion 20c, and the first fixing section 30c are provided in the fourth area S4.

Here, each arm portion and each fixing section that each area of the cantilever section 101 has will be described.

First, each fixing section of each area will be described. When the cantilever section 101 shown in FIG. 5 is viewed in a planar view, the first fixing section 30a of the arm portion 20a and the first fixing section 30b of the arm portion 20b, which are present in the first area S1 (the upper side), and the first fixing section 30c of the arm portion 20c and the first fixing section 30d of the arm portion 20d, which are present in the second area S2 (the lower side), are disposed at positions asymmetrical with respect to the second center line L2.

In the physical quantity detection device 110 of this embodiment, for example, in order to detect a physical quantity, for example, acceleration α1 or α2 (refer to FIG. 3) applied to the physical quantity detection device 110, the physical quantity detection element 70 repeats certain vibration (motion). The vibration is propagated to the base section 10 to which the physical quantity detection element 70 is connected, and the arm portion 20a as parasitic oscillation (spurious) and reaches the first fixing section 30a.

Here, the first fixing section 30a is provided on the main surface 10b side which is connected to the step portion 108a (the base substrate 102). The fixing section connection terminal 36a of the first fixing section 30a is connected to the internal terminal 34a of the step portion 108a through the jointing material 35 so as to overlap the internal terminal 34a when viewed in a planar view. Accordingly, when the step portion 108a and the first fixing section 30a are connected, the first fixing section 30a can selectively connect the main surface 10b side and the step portion 108a.

Therefore, in a case where spurious (parasitic oscillation) which is generated from the physical quantity detection element 70 is propagated to the arm portion 20a through the base section 10, since the position where the arm portion 20a is fixed to the step portion 108a becomes constant, a resonance frequency of the spurious in the arm portion 20a is kept constant.

The structure of the arm portion 20b is the same as that of the arm portion 20a, and therefore, the detailed description of the arm portion 20b is omitted. Further, the structure of the first fixing section 30b is also the same as that of the first fixing section 30a, and therefore, the detailed description of the first fixing section 30b is omitted.

In the arm portion 20c, in the first fixing section 30c, the main surface 10b side and the step portion 108a (the base substrate 102) are selectively connected through the base jointing material 52, as described above. Therefore, in a case where the spurious (the parasitic oscillation) which is generated from the physical quantity detection element 70 is propagated to the arm portion 20c through the base section 10, since the position where the arm portion 20c is fixed to the step portion 108a becomes constant, a resonance frequency of the spurious in the arm portion 20c is kept constant.

The structure of the arm portion 20d is the same as that of the arm portion 20c, and therefore, the detailed description of the arm portion 20d is omitted. Further, the structure of the first fixing section 30d is also the same as that of the first fixing section 30c, and therefore, the detailed description of the first fixing section 30d is omitted.

Further, there is a case where stress of strain which is generated due to a difference in coefficient of thermal expansion or the like between the base section 10 and the base substrate 102 is propagated to the physical quantity detection element 70. In that case, deformation (bending) easily occurs due to the elastic structures of the arm portions 20a, 20b, 20c, and 20d extending from the base section 10, and due to this deformation (bending), it is possible to relax the stress.

Next, the protrusion portions 45a and 45b, and restricting portions 40a and 40b which restrict the displacement in the X direction of the movable section 14 will be described using FIGS. 5 and 6.

FIG. 6 shows a partial cross section taken along line segment d-d of FIG. 5 in an enlarged manner.

As shown in FIG. 5, the protrusion portions 45a and 45b for adjusting a gap in the X direction between the movable section 14 and each of the arm portions 20a and 20b to a predetermined gap G1 are respectively provided at the movable section 14 and one of the arm portions 20 between the support portions, that is, the arm portions 20a and 20b, extending in the +Y direction along the movable section 14 from the base section 10 when viewed in a planar view as viewed from the thickness direction of the cantilever section 101, and the movable section 14. In this embodiment, the protrusion portion 45a protruding toward the arm portion 20a side is formed in the movable section 14, and the protrusion portion 45b protruding toward the movable section 14 side is formed in the arm portion 20b.

Further, "gap portions" each having the predetermined gap G1 are formed between the protrusion portion 45a of the movable section 14 and the arm portion 20a and between the movable section 14 and the protrusion portion 45b formed to protrude toward the movable section 14 side from the arm portion 20b. In this embodiment, the gap portions are referred to as first gap portions. The first gap portions are formed between the movable section 14 and the arm portions 20a and 20b respectively disposed on both sides in an extension direction of the movable section 14, when viewed in a planar view as viewed from the thickness direction of the cantilever section 101 shown in FIG. 5. Further, "gap portions" each having a gap G2 wider than the predetermined gap G1 of the first gap portion are formed further toward the base section 10 side than the first gap portions, and in this embodiment, these gap portions are referred to as second gap portions in distinction from the first gap portions.

The arm portion 20a and the arm portion 20b which are disposed at the base section 10 through the first gap portions each having the predetermined gap G1 with respect to the movable section 14 function as the restricting portions 40a and 40b which restrict the displacement in the X direction of the movable section. That is, the predetermined gap G1 of the first gap portion is a gap set in consideration of an allowable value of the displacement in the X direction of the movable section 14, for preventing excessive displacement in both the X directions (the −X direction and the +X direction) of the movable section 14 or breakage thereof due to the excessive displacement. The action of the restricting portions 40a and 40b will be described later.

In the cantilever section 101, the base section 10, the movable section 14, the joint section 12, and the arm portions 20 (20a, 20b, 20c, and 20d) are formed by performing wet etching on a single crystal material such as a quartz crystal substrate, for example. As a specific material, a plate-shaped quartz crystal substrate (also referred to as a "quartz crystal Z-cut plate (hereinafter referred to as a "Z-cut plate")") which is located along an X-Y plane is used.

In the quartz crystal Z-cut plate, the angle between the normal line to the X-Y plane and the Z-axis is set to be in the range of 0±10°.

The quartz crystal substrate as a substrate forming material described above is subjected to wet etching treatment, whereby the base section 10, the movable section 14, the arm portions 20 (20a, 20b, 20c, and 20d), and the like are integrally formed. If the quartz crystal substrate is subjected to the wet etching treatment, etching progresses along the Z-axis. Quartz crystal has an etching anisotropy specific to a single crystal material such as quartz crystal, in which an etching rate changes according to the direction of each crystal axis, and therefore, a ridge portion (sometimes referred to as a "fin") which is a fin-shaped variant portion which is generated as an etching residue due to an etching anisotropy is formed on a wall surface of the formed void (gap portion), unlike the shape in a case where the shape of the etched surface after being subjected to the wet etching treatment is subjected to isotropic etching. In this embodiment, as shown in FIG. 6, a first ridge portion 4A and a second ridge portion 5A are formed on the facing surfaces (etched surfaces) of the gap portion. In the invention, in order to accurately form the predetermined gap (gap width) of the first gap portion, the shapes of the first ridge portion 4A and the second ridge portion 5A, which can be controlled as the shapes of the etched surfaces by adjusting an opening width of an etching mask at the time of wet etching, are used. Hereinafter, this will be described.

In FIG. 6, a partial cross section of the cantilever section 101 taken along line segment d-d of FIG. 5 is shown in an enlarged manner. However, for convenience of distinguishing it from other embodiments and modifications which will be described later, it is set to be a partial cross section of a cantilever section 101A. Further, in a quartz crystal substrate 1 as a substrate forming material of the cantilever section 101A, the surface on one side of the quartz crystal substrate 1 is shown as a first surface 1a and the surface on the other side is shown as a second surface 1b. Further, in the description of FIG. 6, there is also a case where the first gap portion is referred to simply as a "gap portion".

As shown in FIG. 6, in the first gap portion formed between the protrusion portion 45a of the movable section 14 and the arm portion 20a as the support portion which serves as the restricting portion 40a, a ridge portion having a top portion on the side facing the first gap portion is formed on each of the facing surfaces of the movable section 14 and the arm portion 20a. In this embodiment, the first ridge portion 4A having a top portion 4a is formed on the movable section 14 side, and the second ridge portion 5A having a top portion 5a is formed on the arm portion 20a side.

In the gap portion formed to include the first ridge portion 4A on the movable section 14 side and the second ridge portion 5A on the arm portion 20a side, the predetermined gap G1 (refer to FIG. 5) of the first gap portion in the cantilever section 101 described above is a gap Wg between the top portion 4a of the first ridge portion 4A and the top portion 5a of the second ridge portion 5A in FIG. 6. Further, a first opening portion 6A is formed on the first surface 1a side of the quartz crystal substrate 1 (the cantilever section 101A), and a second opening portion 8A is formed on the second surface 1b side of the quartz crystal substrate 1. Further, when an opening width of the first opening portion 6A in the same direction as the predetermined gap Wg is set to be W1 and an opening width of the second opening portion 8A in the same direction as the predetermined gap Wg is set to be W2, the relationship of Wg<W1<W2 is established.

In the gap portion of the cantilever section according to the invention, at least one of a first inner wall surface 4Aa which is formed from the top portion 4a of the first ridge portion 4A to the first surface 1a side and a second inner wall surface 5Aa which is formed from the top portion 5a of the second ridge portion 5A to the first surface 1a side includes a plurality of surfaces, and at least one of a third inner wall surface 4Ab which is formed from the top portion 4a of the first ridge portion 4A to the second surface 1b side and a fourth inner wall surface 5Ab which is formed from the top portion 5a of the second ridge portion 5A to the second surface 1b side includes a plurality of surfaces. In the gap portion of the cantilever section 101A of this embodiment, the first inner wall surface 4Aa which is formed from the top portion 4a of the first ridge portion 4A to the first surface 1a side includes three surfaces; a surface 111, a surface 112, and a surface 113 in order from the top portion 4a, and the second inner wall surface 5Aa which is formed from the top portion 5a of the second ridge portion 5A to the first surface 1a side is formed with a single surface 311. Further, the third inner wall surface 4Ab which is formed from the top portion 4a of the first ridge portion 4A to the second surface 1b side includes four surfaces; a surface 321, a surface 322, a surface 323, and a surface 324 in order from the top portion 4a, and the fourth inner wall surface 5Ab which is formed from the top portion 5a of the second ridge portion 5A to the second surface 1b side includes three surfaces; a surface 421, a surface 422, and a surface 423 in order from the top portion 5a.

Such a gap portion is formed by causing a first recessed portion which is a prototype of the second opening portion 8A which is formed by performing wet etching from the second surface 1b side of the quartz crystal substrate 1, and a recessed portion which is a prototype of the first opening portion 6A which is formed by performing wet etching from the first surface 1a side of the quartz crystal substrate 1 to be penetrated to each other at bottom portions (recess bottom portions) of the respective recessed portions. That is, in the gap portion, the first inner wall surface 4Aa and the second inner wall surface 5Aa on the first surface 1a side of the quartz crystal substrate 1 are formed at the same time, and the third inner wall surface 4Ab and the fourth inner wall surface 5Ab on the second surface 1b side of the quartz crystal substrate 1 are formed at the same time. The inventors have found that the shape of the inner wall surface of the combination of the first inner wall surface 4Aa and the second inner wall surface 5Aa on the first surface 1a side, and the shape of the inner wall surface of the combination of the third inner wall surface 4Ab and the fourth inner wall surface 5Ab on the second surface 1b side can be formed as the inner wall surfaces of the recessed portions due to an etching anisotropy of quartz crystal by controlling the widths of pattern openings of etching resists which are formed on the respective surfaces of the quartz crystal substrate 1 when wet-etching the quartz crystal substrate 1 from the first surface 1a side and the second surface 1b side, and the predetermined gap Wg of the gap portion having the first ridge portion 4A and the second ridge portion 5A can be accurately formed by causing the two recessed portions to be penetrated to each other at the recess bottom portions. Further, the inventors have found the shapes of three inner wall surface combinations effective for accurately forming the predetermined gap Wg of the gap portion in this manner. Among these, the shape of the combination of the first inner wall surface 4Aa and the second inner wall surface 5Aa on the first surface 1a side of this embodiment is referred to as a first inner wall surface combination 1CW according to the invention, and the shape of the combination of the third inner wall surface 4Ab and the fourth inner wall surface 5Ab on the second surface 1b side is referred to as a third inner wall surface combination 3CW. The form and the like of the remaining second inner wall surface combination 2CW will be described later as other embodiments and modification examples.

The formation of the gap portion by the first inner wall surface combination 1CW and the third inner wall surface combination 3CW of this embodiment will be further described in more detail.

In the gap portion, the third inner wall surface combination 3CW which is formed on the second surface 1b side of the quartz crystal substrate 1 is formed with the third inner wall surface 4Ab which includes the four surfaces; the surface 321, the surface 322, the surface 323, and the surface 324, which are formed from the top portion 4a of the first ridge portion 4A on the movable section 14 side to the second surface 1b side, and the fourth inner wall surface 5Ab which includes the three surfaces; the surface 421, the surface 422, and the surface 423, which are formed from the top portion 5a to the second surface 1b side. Among these, the first surfaces 321 and 421 from the respective top portions 4a and 5a, of the third inner wall surface 4Ab and the fourth inner wall surface 5Ab, are surfaces substantially parallel to the first surface 1a and the second surface 1b. The third inner wall surface combination 3CW is formed such that the width of the opening portion (the opening width W2 of the second opening portion 8A) is the largest among three types of inner wall surface combinations, and an etching rate is the fastest, and thus the manufacturing efficiency is good. Further, in the third inner wall surface combination 3CW for first forming the recessed portion in the formation of the gap portion, the first surfaces 321 and 421 from the top portions 4a and 5a are surfaces substantially parallel to the second surface 1b, and therefore, the range of the position where the recessed portion of the first inner wall surface combination 1CW is formed from the first surface 1a side and then penetrated to the recessed portion formed from the second surface 1b side becomes relatively wide. In this way, the allowable range of the formation position of the opening pattern of the etching resist for forming the first inner wall surface combination 1CW on the first surface 1a side can be widened, and therefore, a decrease in yield due to so-called "mask misalignment" in which the patterning positions of the etching resists which are formed on the first surface 1a side and the second surface 1b side are deviated from each other can be reduced, and thus the effect of increasing a manufacturing margin is obtained.

Further, in the gap portion, the first inner wall surface combination 1CW which is formed on the first surface 1a side of the quartz crystal substrate 1 is formed with the first inner wall surface 4Aa which includes the three surfaces; the surface 111, the surface 112, and the surface 113, which are formed from the top portion 4a of the first ridge portion 4A on the movable section 14 side to the first surface 1a side, and the second inner wall surface 5Aa composed of a single surface 311 formed from the top portion 5a of the second ridge portion 5A on the side of the arm portion 20a as the support portion to the first surface 1a side. The first inner wall surface combination 1CW is formed such that the width of the opening portion (the opening width W1 of the first opening portion 6A) is the smallest among the three types of inner wall surface combinations, and an etching rate is the slowest, and thus the effect that it is possible to increase etching shape forming accuracy is obtained.

In FIG. 6, the first gap portion between the protrusion portion 45a of the movable section 14 and the arm portion 20a serving as the restricting portion 40a, out of the two first gap portions (refer to FIG. 5) each having the predetermined gap G1 (Wg), which are provided in the cantilever section 101A, has been described. However, the first gap portion between the movable section 14 and the protrusion portion 45b of the arm portion 20b serving as the restricting portion 40b is also formed to have the shape of the same inner wall surface combination.

In the physical quantity detection sensor 100 (the physical quantity detection device 110) provided with the cantilever section 101 (101A) having the gap portion (the first gap portion) having the configuration described above, on the side of the free end on the side opposite to the base section 10 side of the movable section 14, the restricting portions 40a and 40b have the predetermined gap G1 (Wg) on both sides in the X-axis direction of the movable section 14. Hereinafter, the effect of the restricting portions 40a and 40b of the cantilever section 101 as the substrate for a sensor will be described.

The restricting portions 40a and 40b (refer to FIGS. 1, and 4 to 6) come into contact with the movable section 14 displaced in the X-axis direction to the greater extent than the predetermined gap G1 (Wg) of the first gap portion, in a case where impact larger than a predetermined magnitude is applied in the X-axis direction of the physical quantity detection sensor 100, in FIG. 1, for example. For this reason, the displacement in both the X-axis directions (the +X side direction and the −X side direction) of the movable section 14 in the X-axis direction is restricted within a predetermined range by the restricting portions 40a and 40b. In this way, excessive displacement of the physical quantity detection device 110 (the cantilever section 101), which occurs due to excessive displacement in the X-axis direction of the movable section 14, or breakage or false detection due to the excessive displacement can be prevented.

Therefore, it is possible to provide the physical quantity detection sensor 100 having high impact resistance and high detection accuracy.

Physical Quantity Detection Element

As shown FIGS. 1, 3, and 4, the physical quantity detection element 70 has two base portions 72 (72a and 72b) and vibration beam portions 71 (71a and 71b) provided between the base portions 72a and 72b, and the two base portions 72 are respectively connected to the base section 10 (the main surface 10b) and the movable section 14 (the main surface 14b), thereby being provided across the joint section 12.

In the physical quantity detection element 70 of this embodiment, for example, the movable section 14 is displaced according to a physical quantity, whereby stress is generated in the vibration beam portions 71a and 71b, and thus physical quantity detection information which is generated in the vibration beam portions 71a and 71b changes. In other words, the vibration frequencies (the resonance frequencies) of the vibration beam portions 71a and 71b change. In this embodiment, the physical quantity detection element 70 is a double-ended tuning fork element (a double-ended tuning fork type vibrator) having the two vibration beam portions 71a and 71b and a pair of base portions 72a and 72b.

The vibration beam portions 71a and 71b are provided to extend between the base portion 72a and the base portion 72b along the Y-axis direction in which the movable section 14 extends. The shape of each of the vibration beam portions 71a and 71b is, for example, a rectangular column shape.

The vibration beam portions 71a and 71b perform bending vibration so as to be separated from each other or come close to each other along the X-axis direction if a drive signal is applied to excitation electrodes (not shown) provided at the vibration beam portions 71a and 71b.

The base portions 72a and 72b are connected to both ends in an extension direction of the vibration beam portions 71a and 71b. The base portion 72a as an end portion on one side of the physical quantity detection element 70 is connected to the main surface 10b of the base section 10 through a detection element jointing material 84. Further, the base portion 72b as an end portion on the other side of the physical quantity detection element 70 is connected to the main surface 14b of the movable section 14 through the detection element jointing material 84. As the detection element jointing material 84, for example, low-melting-point glass or an alloy coating of gold (Au) and tin (Sn), in which eutectic bonding can be made, may be used.

The physical quantity detection element 70 in this embodiment is formed, for example, by patterning a quartz crystal substrate cut-out at a predetermined angle from so-called quartz crystal raw ore or the like, by a photolithography technique and an etching technique. In this way, it is possible to integrally form the vibration beam portions 71a and 71b and the base portions 72a and 72b.

A material of the physical quantity detection element 70 is not limited to the quartz crystal substrate described above. For example, a piezoelectric material such as lithium tantalate ($LiTaO_3$), lithium tetraborate ($Li_2B_4O_7$), lithium niobate ($LiNbO_3$), lead zirconate titanate (PZT), zinc oxide (ZnO), or aluminum nitride (AlN) may be used. Further, a semiconductor material such as silicon provided with a piezoelectric body (piezoelectric material) coating such as zinc oxide (ZnO) or aluminum nitride (AlN) may be used.

For example, an extraction electrode (not shown) is provided on the base portion 72a of the physical quantity detection element 70. The extraction electrode is electrically connected to the excitation electrodes (not shown) provided at the vibration beam portions 71a and 71b.

The extraction electrode is electrically connected to a connection terminal (not shown) provided on the main surface 10b of the base section 10, by a metal wire (not shown) such as gold (Au) or aluminum (Al), for example.

The connection terminal is electrically connected to the fixing section connection terminals 36a and 36b by wiring (not shown).

As each of the excitation electrodes, the extraction electrode, the connection terminal, and the fixing section connection terminals 36a and 36b, a laminated body in which, for example, a chromium (Cr) layer is provided as a foundation and a gold (Au) layer is laminated thereon is used. The excitation electrodes, the extraction electrode, the connection terminal, and the fixing section connection terminals 36a and 36b are provided by forming a conductive layer by, for example, sputtering method or the like and patterning the conductive layer.

In the physical quantity detection element 70 in this embodiment, the vibration beam portions 71a and 71b provided between the two base portions 72a and 72b are disposed to intersect (be orthogonal to) the joint section 12. In other words, the vibration beam portions 71a and 71b are disposed along a direction intersecting a direction in which the groove portions 12a and 12b extend. In this way, it becomes possible to directly transmit the bending of the movable section 14 when, for example, acceleration is applied thereto, to the vibration beam portions 71a and 71b. Therefore, slight bending of the movable section 14 can also be detected as a change in the resonance frequency in the vibration beam portions 71a and 71b, and thus it becomes possible to prevent a decrease in detection sensitivity.

The physical quantity detection element 70 is provided on the main surface 10b on the inner bottom surface 109a side with respect to the base section 10, and the main surface 14b. However, a configuration in which the physical quantity detection element 70 is provided on the main surface 10a on the lid 103 side with respect to the base section 10, and the main surface 14a is also conceivable.

Method of Manufacturing Cantilever Section

Here, a method of manufacturing the cantilever section 101 as the substrate for a sensor, in particular, a method of forming the gap portion, related to a method of manufacturing the physical quantity detection device 110 of this embodiment, will be described with reference to the drawings.

FIGS. 7A to 7M are partial cross-sectional views shown with the same cross section as that in FIG. 6 and show processes of forming the gap portion according to the invention by applying a photolithography technique which includes wet etching.

Figure 7A:
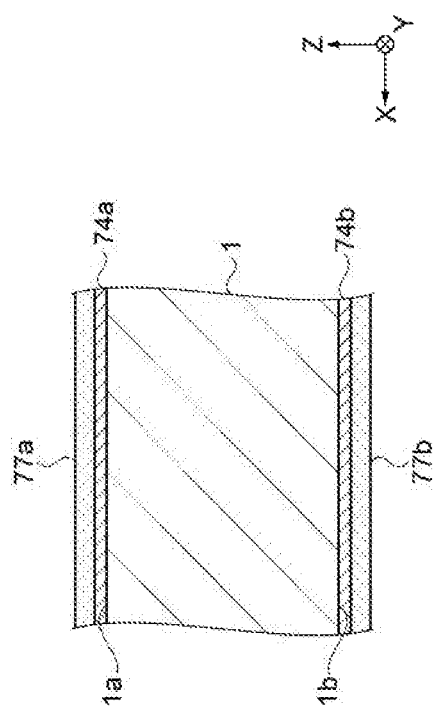
FIG. 7A is a partial cross-sectional view showing a process of state transition in a method of manufacturing a cantilever section related to a method of manufacturing the physical quantity detection sensor of Embodiment 1 with the same cross section as that in FIG. 6.

In a method of manufacturing the cantilever section 101A of this embodiment, first, as shown in FIG. 7A, the quartz crystal substrate 1 is prepared and a corrosion-resistant film 74a and a corrosion-resistant film 74b are respectively formed on the first surface 1a and the second surface 1b which are the surfaces of the quartz crystal substrate 1. As the corrosion-resistant film, for example, a two-layer structure in which a Cr (chromium) film as a foundation layer having excellent adhesiveness to quartz crystal and an Au (gold) film having excellent corrosion resistance with respect to an etching solution for quartz crystal are laminated by sputtering or vapor deposition is suitably used. Further, photoresist layers 77a and 77b are respectively formed on the corrosion-resistant films 74a and 74b by spin coating or the like.

Figure 7B:
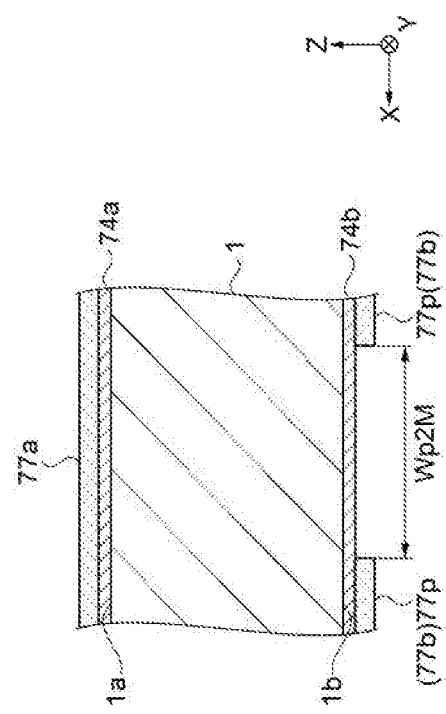
FIG. 7B is a partial cross-sectional view showing a process of state transition in the method of manufacturing a cantilever section according to Embodiment 1 with the same cross section as that in FIG. 6.
Figure 7C:
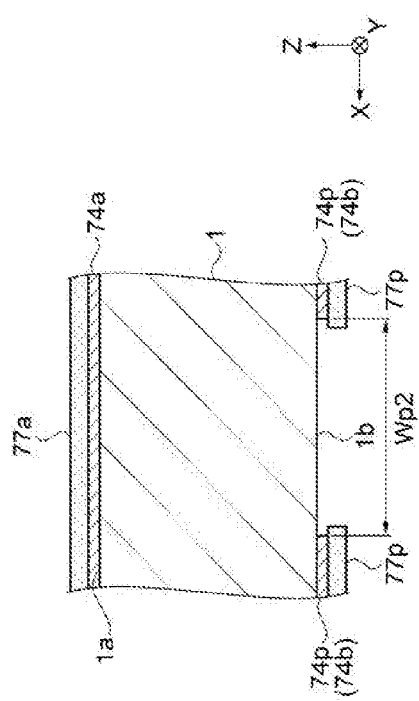
FIG. 7C is a partial cross-sectional view showing a process of state transition in the method of manufacturing a cantilever section according to Embodiment 1 with the same cross section as that in FIG. 6.

Next, as shown in FIG. 7B, after the photoresist layer 77b on the second surface 1b side on which wet etching is performed first, of the quartz crystal substrate 1, is exposed by an exposure device using a photomask having a pattern corresponding to a first pattern opening Wp2 (refer to FIGS. 7C and 7D) of a corrosion-resistant film pattern 74p to be formed in a later process, development is performed to leave a photoresist pattern 77p, whereby a photoresist pattern opening Wp2M is formed.

Figure 7D:
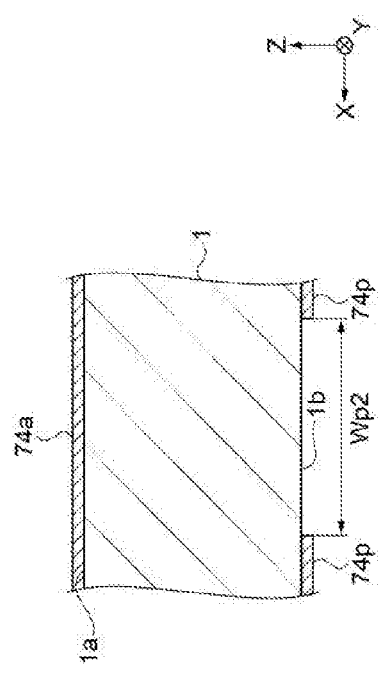
FIG. 7D is a partial cross-sectional view showing a process of state transition in the method of manufacturing a cantilever section according to Embodiment 1 with the same cross section as that in FIG. 6.
Figure 7E:
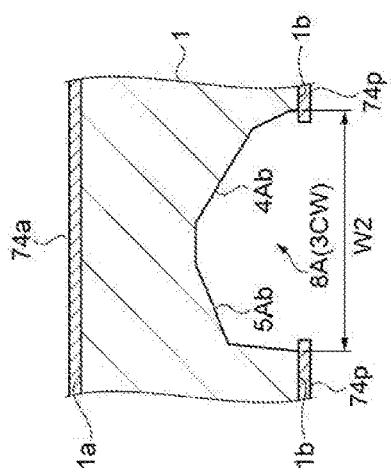
FIG. 7E is a partial cross-sectional view showing a process of state transition in the method of manufacturing a cantilever section according to Embodiment 1 with the same cross section as that in FIG. 6.

Next, the first pattern opening Wp2 and the first corrosion-resistant film pattern 74p serving as a mask pattern for etching of the quartz crystal substrate 1 are formed by exposing the surface of the second surface 1b of the quartz crystal substrate 1 by etching the corrosion-resistant film 74b which is exposed in the photoresist pattern opening Wp2M by using an etching solution for a corrosion-resistant film (FIG. 7C), and thereafter, the photoresist pattern 77p on the second surface 1b side and the photoresist layer 77a on the first surface 1a side are removed (FIG. 7D).

Here, the width Wp2 of the first pattern opening which is formed by the first corrosion-resistant film pattern 74p can be determined by satisfying the relationship of the following Expression (10) when a predetermined gap of a gap portion to be formed is set to be Wg, an etching depth of the quartz crystal substrate 1 in first etching of the next process is set to be d, and the limit value of the amount of displacement of the movable section 14 in the cantilever section 101A is set to be Wgmax.

$$1.9393d + 0.2083 \leq Wp2 \leq Wgmax + 1.956d \quad (10)$$

Here, the limit value Wgmax of the amount of displacement of the movable section 14 refers to, for example, a limit amount of displacement at which the movable section 14 is not broken in a case where impact is applied thereto from the outside. Further, it is desirable that the depth d of the first etching is set to be approximately half of the thickness of the quartz crystal substrate 1.

By forming the width Wp2 of the first pattern opening determined so as to satisfy the relationship of Expression (10), it is possible to form the second opening portion 8A having the shape of the third inner wall surface combination 3CW in the first etching of the next process. The width of the photoresist pattern opening Wp2M of the photoresist pattern 77p described in FIG. 7B is set such that the width corresponding to the width Wp2 of the first pattern opening, that is, the first pattern opening which is formed by etching the corrosion-resistant film 74b which is exposed in the photoresist pattern opening Wp2M has the width Wp2.

Figure 7F:
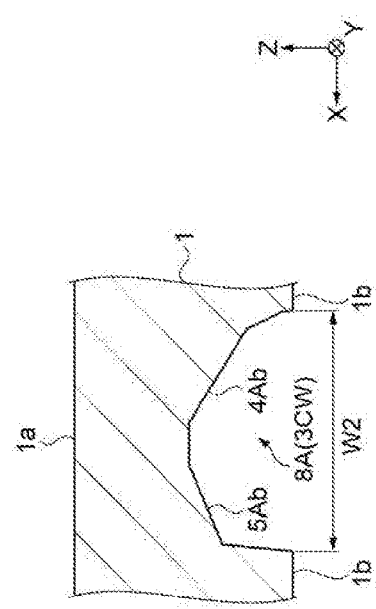
FIG. 7F is a partial cross-sectional view showing a process of state transition in the method of manufacturing a cantilever section according to Embodiment 1 with the same cross section as that in FIG. 6.

Next, the first etching for forming the second opening portion 8A as the first recessed portion in the quartz crystal substrate 1 by wet-etching the surface of the second surface 1b of the quartz crystal substrate 1 exposed in the first pattern opening Wp2, as shown in FIG. 7D, for a predetermined time is performed using the first corrosion-resistant film pattern 74p as an etching mask (FIG. 7E), and subsequently, the first corrosion-resistant film pattern 74p on the second surface 1b side and the corrosion-resistant film 74a on the first surface 1a side are removed, whereby the second opening portion 8A having the shape of the third inner wall surface combination 3CW having the opening width W2 is obtained (FIG. 7F).

Up to here, a method of performing the first etching after the removal of the photoresist pattern 77p and the photoresist layer 77a on the first corrosion-resistant film pattern 74p and the corrosion-resistant film 74a has been described. However, if there is no problem such as contamination by the etching solution, it is also possible to perform the first etching while leaving the photoresist pattern 77p and the photoresist layer 77a.

Figure 7G:
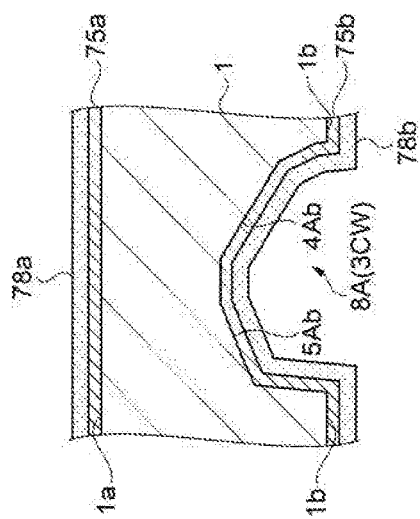
FIG. 7G is a partial cross-sectional view showing a process of state transition in the method of manufacturing a cantilever section according to Embodiment 1 with the same cross section as that in FIG. 6.

Next, a process of covering at least the inner surface of the second opening portion 8A as the first recessed portion with a protective film is performed. This is because it is also possible to perform a process which includes the subsequent second etching by using the corrosion-resistant film 74a while leaving the first corrosion-resistant film pattern 74p and the corrosion-resistant film 74a in the state after the first etching shown in FIG. 7E and in this case, it is necessary to form a protective film against the wet etching solution for quartz crystal in the second opening portion 8A in which the surface of the quartz crystal substrate 1 is exposed. In this embodiment, the corrosion-resistant film 74a damaged by the first etching is peeled off together with the first corrosion-resistant film pattern 74p, a corrosion-resistant film is newly formed, and the subsequent step which includes the second etching is then performed. Therefore, corrosion-resistant films 75a and 75b are formed on the surfaces of the quartz crystal substrate 1 in which the second opening portion 8A shown in FIG. 7F is formed (FIG. 7G). In this way, the inner surface of the second opening portion 8A is covered with the corrosion-resistant film 75b as a protective film. Next, the state shown in FIG. 7G is created by forming photoresist layers 78a and 78b on the corrosion-resistant films 75a and 75b by spin coating or the like.

Figure 7H:
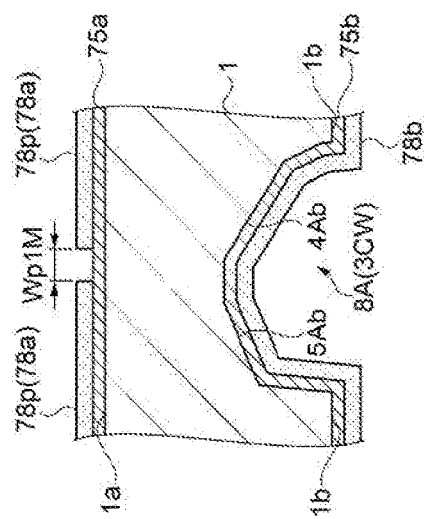
FIG. 7H is a partial cross-sectional view showing a process of state transition in the method of manufacturing a cantilever section according to Embodiment 1 with the same cross section as that in FIG. 6.

Next, as shown in FIG. 7H, after the photoresist layer 78a on the first surface 1a side to be subjected to the second etching is exposed by an exposure device using a photomask having a pattern corresponding to a second pattern opening Wp1 (refer to FIGS. 7J and 7K) of the corrosion-resistant film 75a to be formed in a later process, development is performed to leave a photoresist pattern 78p, whereby a photoresist pattern opening Wp1M is formed.

Figure 7J:
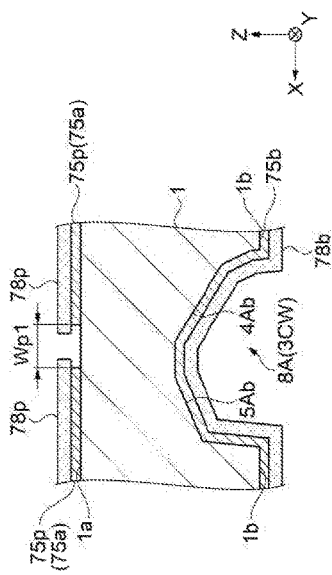
FIG. 7J is a partial cross-sectional view showing a process of state transition in the method of manufacturing a cantilever section according to Embodiment 1 with the same cross section as that in FIG. 6.

Next, as shown in FIG. 7J, the second pattern opening Wp1 and a second corrosion-resistant film pattern 75p serving as a mask pattern for etching of the quartz crystal substrate 1 are formed by exposing the surface of the first surface 1a of the quartz crystal substrate 1 by etching the corrosion-resistant film 75a which is exposed in the photoresist pattern opening Wp1M by using an etching solution for a corrosion-resistant film.

Figure 7K:
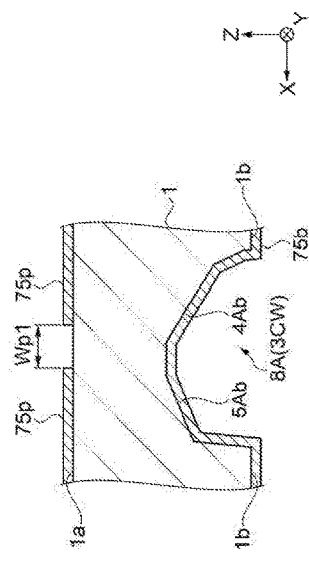
FIG. 7K is a partial cross-sectional view showing a process of state transition in the method of manufacturing a cantilever section according to Embodiment 1 with the same cross section as that in FIG. 6.

Subsequently, the photoresist pattern 78p on the first surface 1a side and the photoresist layer 78b on the second surface 1b side are removed (FIG. 7K). Here, similar to the above description, if there is no influence such as contamination by the etching solution which is used in the second etching of the subsequent process, it is also possible to perform the second etching while leaving the photoresist pattern 78p and the photoresist layer 78b on the second surface 1b side on the second corrosion-resistant film pattern 75p and the corrosion-resistant film 75b.

Here, the width Wp1 of the second pattern opening which is formed by the second corrosion-resistant film pattern 75p can be determined by satisfying the relationship of the following Expression (11) when the etching depth of the quartz crystal substrate 1 in the second etching of the next process is set to be d.

$$0 < Wp1 \leq 0.7735d + 0.5 \qquad (11)$$

Here, it is desirable that the depth d of the first etching is set to be approximately half of the thickness of the quartz crystal substrate 1.

The inventors have found that due to forming the width Wp1 of the second pattern opening determined so as to satisfy the relationship of Expression (11), the predetermined gap Wg of the gap portion can be accurately formed by forming the first opening portion 6A having the shape of the first inner wall surface combination 1CW in the second etching of the next process, and penetrating the bottom portion (the recess bottom portion) of the second opening portion 8A on the second surface 1b side formed in the first etching.

Figure 7L:
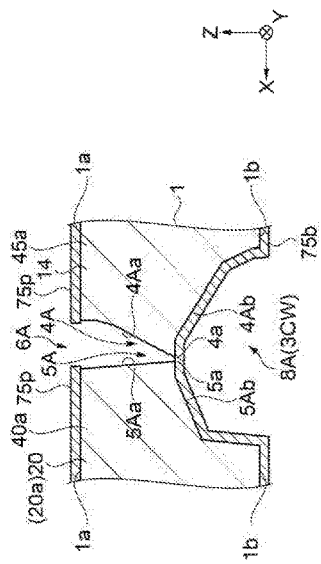
FIG. 7L is a partial cross-sectional view showing a process of state transition in the method of manufacturing a cantilever section according to Embodiment 1 with the same cross section as that in FIG. 6.

Next, by performing the second etching to form the first opening portion 6A as the second recessed portion in the quartz crystal substrate 1 by wet-etching the surface of the first surface 1a of the quartz crystal substrate 1 exposed in the second pattern opening Wp1 for a predetermined time using the second corrosion-resistant film pattern 75p as an etching mask, and to penetrate the recess bottom portion of the first opening portion 6A having a recess shape to the recess bottom portion of the second opening portion 8A, the first ridge portion 4A having the top portion 4a on the movable section 14 side and the second ridge portion 5A having the top portion 5a on the side of the arm portion 20a as the support portion are formed (FIG. 7L).

Figure 7M:
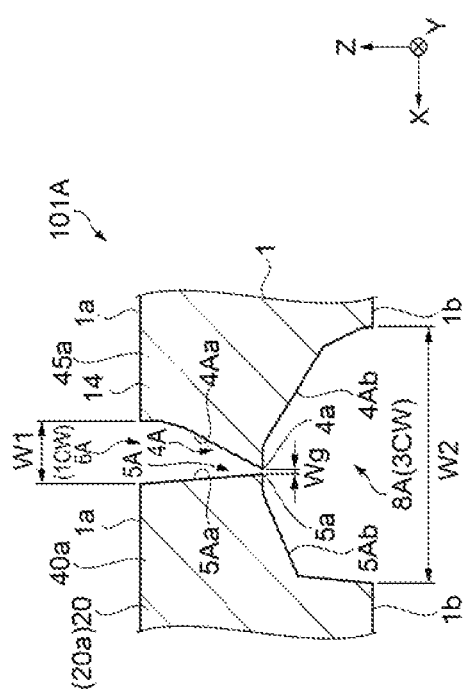
FIG. 7M is a partial cross-sectional view showing a process of state transition in the method of manufacturing a cantilever section according to Embodiment 1 with the same cross section as that in FIG. 6.

Subsequently, as shown in FIG. 7M, by removing the second corrosion-resistant film pattern 75p on the first surface 1a side and the corrosion-resistant film 75b on the second surface 1b side which includes the third inner wall surface 4Ab and the fourth inner wall surface 5Ab of the second opening portion 8A, the first opening portion 6A having the shape of the first inner wall surface combination 1CW having the opening width W1 and the second opening portion 8A are penetrated to each other, whereby the gap portion having the predetermined gap Wg (G1) which is a gap between the top portion 4a of the first ridge portion 4A and the top portion 5a of the second ridge portion 5A is formed. In this way, the predetermined gap Wg between the movable section 14 and the restricting portion 40a restricting excessive displacement of the movable section 14 is formed accurately, and thus the cantilever section 101A which is a substrate for a physical quantity detection sensor (the substrate for a sensor) having high impact resistance and high detection accuracy is obtained, and a series of manufacturing processes is ended.

Operation of Physical Quantity Detection Device

Next, an operation of the physical quantity detection device 110 will be described using FIG. 3.

In FIG. 3, as three axes orthogonal to each other, the X-axis, the Y-axis, and the Z-axis are shown. The Z-axis is an axis indicating a direction in which the gravity acts.

In FIG. 3, for example, if the acceleration α1 (acceleration which is applied in the direction of the gravitational force) as a physical quantity is applied in a −Z-axis direction to the physical quantity detection device 110, the movable section 14 is displaced in the −Z-axis direction with the joint section 12 as a supporting point, according to the acceleration α1. In this way, in the physical quantity detection element 70, a force (tension) in a direction of an arrow β1 (a direction away from each other) is applied to the base portion 72a and the base portion 72b along the Y-axis, and thus tensile stress in the direction of the arrow β1 is generated in the vibration beam portions 71a and 71b. For this reason, the vibration frequencies (the resonance frequencies) of the vibration beam portions 71a and 71b becomes higher.

On the other hand, for example, if the acceleration α2 (acceleration which is applied in a direction opposite to the direction of the gravitational force) is applied in the +Z-axis direction to the physical quantity detection device 110, the movable section 14 is displaced in the +Z-axis direction with the joint section 12 as a supporting point, according to the acceleration α2. In this way, in the physical quantity detection element 70, a force (a compressive force) in a direction of an arrow β2 (a direction approaching each other) is applied to the base portion 72a and the base portion 72b along the Y-axis, and thus compressive stress in the direction of the arrow β2 is generated in the vibration beam portions 71a and 71b. For this reason, the vibration frequencies (the resonance frequencies) of the vibration beam portions 71a and 71b becomes lower.

The physical quantity detection sensor 100 may be equipped with an electronic circuit for processing an output signal which is output from the physical quantity detection device 110. For example, in the physical quantity detection sensor 100 shown in FIG. 3, it is possible to make a configuration in which the electronic circuit is provided within the recessed portion 106 of the base substrate 102.

In the physical quantity detection sensor 100 as described above, a drive signal is applied from the electronic circuit to the excitation electrode (not shown) of the physical quantity detection device 110 via the internal terminals 34a and 34b (not shown). If the drive signal is applied, the vibration beam portions 71a and 71b of the physical quantity detection element 70 perform bending vibration (resonance) at a predetermined frequency. Then, in the physical quantity detection sensor 100, the physical quantity detection element 70 changes according to the acceleration α1 or α2 which is applied thereto. A resonance frequency which is output from the physical quantity detection element 70 due to the change thereof is amplified in the electronic circuit and is output from the external terminals 107a and 107b to the outside of the physical quantity detection sensor 100 by wiring (not shown).

The physical quantity detection sensor 100 may be used as an inclination sensor, in addition to being used as the above-described acceleration sensor in which the detection of acceleration is possible. In the physical quantity detection sensor 100 as an inclination sensor, if a direction in which gravitational acceleration is applied to the physical quantity detection sensor 100 changes according to a change in attitude due to inclination, the movable section 14 is bent due to the weight of the mass sections 80 and 82, and thus tensile stress or compressive stress is generated in the vibration beam portions 71a and 71b of the physical quantity detection element 70. Then, the resonance frequencies of the vibration beam portions 71a and 71b change. The state of an attitude due to inclination is derived based on the change.

As described above, according to the physical quantity detection sensor 100 according to this embodiment, the following effects are obtained.

According to the embodiment described above, the cantilever section 101 (101A) as the substrate for a sensor of the physical quantity detection sensor 100 has the base section 10, the movable section 14 connected to the base section 10, the arm portions 20 (20a and 20b) as the support portions which extend along the movable section 14 from the base section 10 when viewed in a planar view as viewed from a thickness direction of the movable section 14, and the gap portion (the first gap portion) having the predetermined gap G1 (Wg) between the movable section 14 and each of the arm portions 20a and 20b when viewed in the planar view, in which in the gap portion, the first ridge portion 4A and the second ridge portion 5A which are ridge portions protruding as etching residues are respectively formed on the facing surfaces of the movable section 14 and each of the arm portions 20a and 20b, and the predetermined gap G1 (Wg) of the gap portion is a gap between the top portion 4a of the first ridge portion 4A on the movable section 14 side and the top portion 5a of the second ridge portion 5A on the side of each of the arm portions 20a and 20b.

Due to this configuration, the gap portion having the predetermined gap G1 (Wg) is formed between the movable section 14 and each of the arm portions 20a and 20b as the support portions extending along the movable section 14 from the base section 10, and in the gap portion, the first ridge portion 4A and the second ridge portion 5A protruding as etching residues are respectively formed on the facing surfaces of the movable section 14 and each of the arm portions 20a and 20b. The inventors have found that, when forming the gap portion having such a configuration by wet etching, by setting the first pattern opening Wp2 and the second pattern opening Wp1, which are the opening widths of the etching masks, to predetermined widths which are calculated by the above-described expressions, the shape of each of the first ridge portion 4A and the second ridge portion 5A which face each other in the gap portion can be formed to be controlled to a desired shape. In this regard, it becomes possible to accurately form the gap G1 (Wg) of the gap portion.

Further, the cantilever section 101 has the second gap portion which is located further toward the base section 10 side than the first gap portion and has the gap G2 wider than the predetermined gap G1 (Wp) of the first gap portion. In this way, when forming the outer shape of the cantilever section 101 (101A) by wet-etching the quartz crystal substrate 1, in the first ridge portion 4A and the second ridge portion 5A formed on the movable section 14 and one of the arm portions 20 in the first gap portion, it becomes easy to accurately form a desired shape, because etching solution impregnation to the first gap portion becomes good due to the second gap portion having the gap G2 wider than the gap G1 (Wg) of the first gap portion.

Due to these configurations, it is possible to provide the first gap portion in which the predetermined gap G1 (Wg), which performs restriction such that the displacement of the movable section 14 does not become excessive when impact in an in-plane direction (the X direction) of the movable section 14 and the arm portions 20 (20a and 20b) is applied, is accurately formed, and therefore, a structure in which the excessive displacement of the movable section 14 is restricted by the restricting portions 40a and 40b of the arm portions 20 (20a and 20b) can be realized.

Therefore, it is possible to provide the physical quantity detection sensor 100 having high impact resistance, in which when impact is applied, excessive displacement of the cantilever section 101 or the physical quantity detection element 70 or breakage thereof due to the excessive displacement can be prevented.

Further, the gap length (G1, Wg) of the first gap portion is also prevented from becoming smaller than a design value, and therefore, trouble in which the set detection range of a physical quantity such as acceleration is not satisfied due to the displacement range of the movable section being restricted to be smaller than the setting can be avoided. Therefore, it becomes possible to provide the physical quantity detection sensor 100 having high detection accuracy.

Further, in the above-described embodiment, a configuration is made in which each of the first gap portion and the second gap portion is formed in a plurality (by two) and a plurality of (two) protrusion portions 45a and 45b protrude in the same direction.

In this way, when forming the outer shape of the cantilever section 101 by wet-etching a quartz crystal substrate, the first ridge portion 4A and the second ridge portion 5A are formed in a predetermined crystal axis direction (the +X crystal axis direction), and therefore, the respective protrusion portions 45a and 45b are provided to protrude in the same direction, whereby it is possible to substantially uniformly and accurately form the predetermined gap G1 (Wg) of each of the first gap portions.

Further, in the gap portion of the cantilever section 101A of this embodiment, when the opening width in the same direction as the predetermined gap G1 (Wg), of the first opening portion 6A which is an opening portion on the first surface 1a side, is set to be W1, the opening width in the same direction as the predetermined gap G1 (Wg), of the second opening portion 8A which is an opening portion on the side of the second surface 1b on the side opposite to the first surface 1a, is set to be W2, and the predetermined gap is set to be Wg, a configuration having the relationship of Wg<W1<W2 is made.

Further, in this embodiment, in the cantilever section 101 (101A), a configuration is made in which the second surface 1b side of the quartz crystal substrate 1 is the third inner wall surface combination 3CW and the first surface 1a side is the first inner wall surface combination 1CW.

In this configuration, the third inner wall surface combination 3CW having the opening portion (the second opening portion 8A) on the second surface 1b side is formed such that the opening width (W2) of the opening portion is the largest among three types of inner wall surface combinations found by the inventors of the invention, and an etching rate is the fastest. Further, the first inner wall surface combination 1CW of the first opening portion 6A formed on the first surface 1a side is formed such that the opening width (W1) is the smallest among the three types of inner wall surface combinations, and an etching rate is the slowest, and thus etching shape forming accuracy is the highest.

According to such inner wall surface combinations, when forming the cantilever section 101 (101A) having the gap portion by wet-etching the quartz crystal substrate 1, by first forming the recessed portion by the third inner wall surface combination 3CW having a larger opening width from the second surface 1b side, then forming the recessed portion by the first inner wall surface combination 1CW having a smaller opening width from the first surface, and causing the recess bottom portions of the respective recessed portions to be penetrated to each other, it is possible to form the first ridge portion 4A and the second ridge portion 5A in a state where the accuracy of the predetermined gap Wg (G1) of the gap portion is enhanced.

Further, in the third inner wall surface combination 3CW for first forming the recessed portion from the second surface 1b side, the surface 321 and the surface 421 which are the first surfaces from the top portions 4a and 5a are surfaces substantially parallel to the second surface 1b, and therefore, the range of the position where the recessed portion of the first inner wall surface combination 1CW is formed from the first surface 1a side and then penetrated to the recessed portion formed from the second surface 1b side becomes relatively wide. In this way, the allowable range of the formation position of the opening (the second pattern opening Wp1) of the etching resist for forming the first opening portion 6A of the first inner wall surface combination 1CW on the first surface 1a side can be widened, and therefore, a decrease in yield due to so-called "mask misalignment" in which the patterning positions of the etching resists which are formed on the first surface 1a side and the second surface 1b side are deviated from each other can be reduced, and thus the effect of increasing a manufacturing margin is obtained.

Further, the cantilever section 101 as the substrate for a sensor of the above-described embodiment is formed using a quartz crystal Z-cut plate cut out in a Z-cut. Further, the protrusion portions 45a and 45b in the first gap portion are disposed so as to protrude in the +X crystal axis direction of the quartz crystal Z-cut plate.

In this way, the inventors have found that the influence of a crystal plane from the Y-axis direction is suppressed, and thus, when viewed in a planar view as viewed from the thickness direction of the cantilever section 101, the wall surfaces of the first ridge portion 4A and the second ridge portion 5A which are formed at the protrusion portions 45a and 45b are formed in a desired shape and the first gap portion can be accurately formed at a desired gap width (a predetermined gap) G1 (Wg).

Further, in the quartz crystal Z-cut plate, etching is relatively easy due to its characteristics, and thus it is possible to more accurately form the outer shape such as the first gap portion of the cantilever section 101 (101A).

Further, a cut-out angle in the thickness direction of the cantilever section 101 (101A) and a cut-out angle in the thickness direction of the physical quantity detection element 70 are made to be the same Z-cut, whereby it is possible to approximate linear expansion coefficients (coefficients of thermal expansion) to each other. Therefore, the thermal stress between the cantilever section 101 and the physical quantity detection element 70 due to an ambient temperature change thereof is suppressed, and this can contribute to providing the physical quantity detection sensor 100 in which it is possible to perform physical quantity measurement having high detection accuracy with thermal stress suppressed.

Further, it is possible to provide the physical quantity detection sensor 100 in which in a case where stress of strain which is generated due to a difference in coefficient of thermal expansion, or the like between the base section 10 and the base substrate 102 is propagated to the physical quantity detection element 70, deformation (bending) easily occurs due to the elastic structures of the arm portions 20a, 20b, 20c, and 20d extending from the base section 10, and due to this deformation (bending), it is possible to relax the stress.

Therefore, even in a case where spurious which is generated from the physical quantity detection element 70 is propagated to the first fixing sections 30 (30a, 30b, 30c, and 30d) through the base section 10, the area and the position which are fixed become constant, and therefore, the resonance frequency of the spurious is kept constant.

Further, the physical quantity detection element 70 in the physical quantity detection sensor 100 of this embodiment is connected (fixed) to the base section 10 and the movable section 14. In this way, both ends (the base portions 72a and 72b) of the physical quantity detection element 70 are fixed, and therefore, vibration other than the vibration of the physical quantity detection element 70 is prevented from being detected as noise. Further, the influence of the strain of the detection element jointing material 84 and a strain due to a difference in coefficient of thermal expansion between the physical quantity detection element 70 and the base substrate 102 is suppressed, and thus it is possible to provide the physical quantity detection sensor 100 in which it is possible to prevent breakage of the physical quantity detection element 70.

Further, the physical quantity detection sensor 100 is a sensor having high detection accuracy, in which the movable section 14 is displaced according to a physical quantity applied thereto and the physical quantity detection element 70 can detect the displacement.

Embodiment 2

Hereinafter, modification examples of the cantilever section 101 as the substrate for a sensor in the physical quantity detection sensor 100 of the embodiment described above will be described with reference to the drawings. The same configurations as those in the embodiment described above are denoted by the same reference numerals and overlapping description is omitted.

Figure 8:
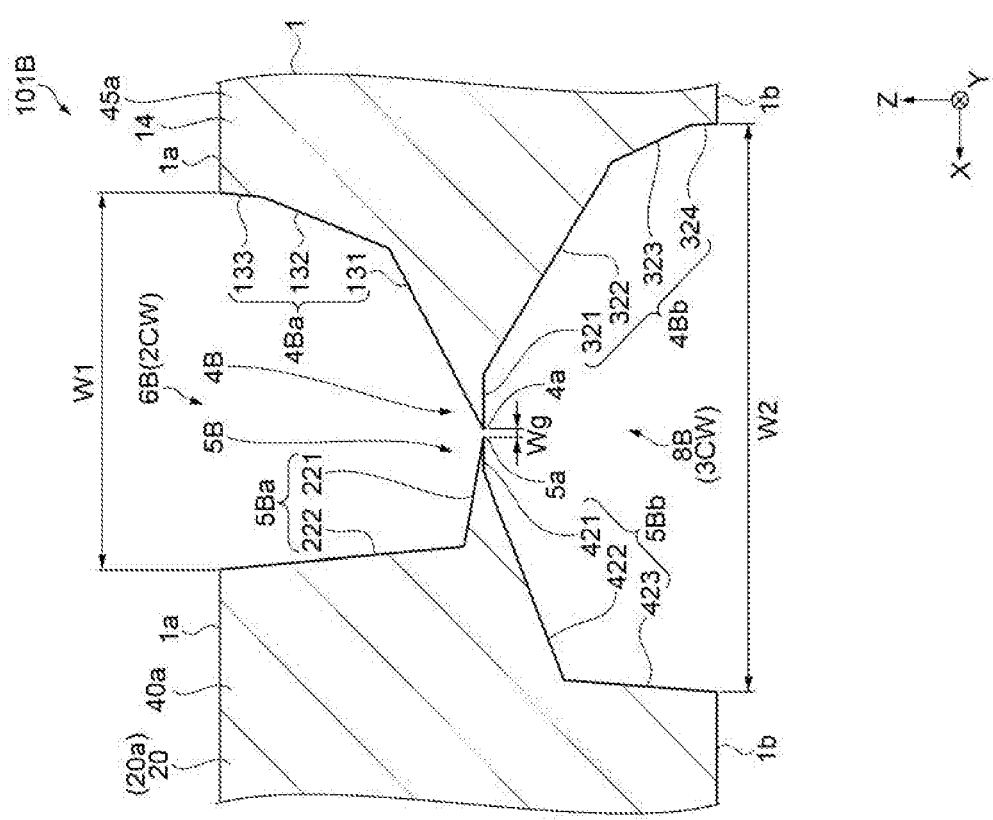
FIG. 8 is a partial cross-sectional view showing a cantilever section as a substrate for a sensor according to Embodiment 2 with the same cross section as that in FIG. 6.

FIG. 8 is a partial cross-sectional view showing a cantilever section 101B as a substrate for a sensor according to Embodiment 2 with the same cross section as that in FIG. 6.

In FIG. 8, a gap portion of the cantilever section 101B according to Embodiment 2 is formed by causing a second opening portion 8B, which is formed on the second surface 1b side of the quartz crystal substrate 1 and is the same third inner wall surface combination 3CW as that of the second opening portion 8A (refer to FIG. 6) in the cantilever section 101A of Embodiment 1, and a first opening portion 6B of the second inner wall surface combination 2CW, which is formed on the first surface 1a side and is a new inner wall surface combination, to be penetrated to each other at substantially the center in the thickness direction of the quartz crystal substrate 1.

The second opening portion 8B formed in the second surface 1b of the quartz crystal substrate 1 is formed with the third inner wall surface combination 3CW composed of a third inner wall surface 4Bb having the surface 321, the surface 322, the surface 323, and the surface 324 toward the second surface 1b from the top portion 4a of a first ridge portion 4B on the movable section 14 side, and a fourth inner wall surface 5Bb having the surface 421, the surface 422, and the surface 423 toward the second surface 1b from the top portion 5a of a second ridge portion 5B on the arm portion 20a side.

The first opening portion 6B of the second inner wall surface combination 2CW which is formed on the first surface 1a side of the quartz crystal substrate 1 is formed to have a first inner wall surface 4Ba which includes three surfaces; a surface 131, a surface 132, and a surface 133, formed from the top portion 4a of the first ridge portion 4B on the movable section 14 side to the first surface 1a side, and a second inner wall surface 5Ba composed of two surfaces; a surface 221 and a surface 222, formed from the top portion 5a of the second ridge portion 5B on the side of the arm portion 20a as the support portion to the first surface 1a side. In the second inner wall surface combination 2CW, the width of the opening portion (the opening width W1 of the first opening portion 6B) has a width intermediate between that of the first inner wall surface combination 1CW and that of the third inner wall surface combination 3CW, among the three types of inner wall surface combinations which include the first inner wall surface combination 1CW and the third inner wall surface combination 3CW described above. The gap portion formed by causing the first opening portion 6B by the second inner wall surface combination 2CW and the second opening portion 8B by the third inner wall surface combination 3CW formed on the second surface 1b side to be penetrated to each other at substantially the center of the quartz crystal substrate 1 has the first ridge portion 4B formed on the movable section 14 side and the second ridge portion 5B formed on the arm portion 20a side, and the predetermined gap Wg is formed between the top portion 4a of the first ridge portion 4B and the top portion 5a of the second ridge portion 5B. That is, the opening width W1 of the first opening portion 6B formed on the first surface 1a side, the opening width W2 of the second opening portion 8B formed on the second surface 1b side, and the predetermined gap Wg of the gap portion have the relationship of Wg<W1<W2.

In the gap portion of the cantilever section 101B of this embodiment, the width Wp2 of the first pattern opening which is formed by the first corrosion-resistant film pattern 74p for the first etching in the method of manufacturing the cantilever section of Embodiment 1 described above can be determined by satisfying the relationship of the following Expression (12), similar to the case of forming the shape of the third inner wall surface combination 3CW of Embodiment 1.

$$1.9393d+0.2083 \leq Wp \leq Wg\max+1.956d \quad (12)$$

Further, the width of the second pattern opening Wp1 which is formed by the second corrosion-resistant film pattern 75p for the second etching can be determined by satisfying the relationship of the following Expression (13).

$$0.7735d+0.5 \leq Wp \leq 1.9393d+0.2083 \quad (13)$$

Due to forming the width Wp1 of the second pattern opening determined so as to satisfy the relationship of Expression (13), the predetermined gap Wg of the gap portion can be accurately formed by forming the first opening portion 6B having the shape of the second inner wall surface combination 2CW in the second etching of the next process and penetrating the bottom portion (the recess bottom portion) of the second opening portion 8B on the second surface 1b side, formed by the first etching.

According to the cantilever section 101B having the gap portion formed by the inner wall surface combinations of this embodiment, the following effects are obtained.

In this embodiment, the shape of the second opening portion 8B as the first recessed portion which is formed by wet-etching the second surface 1b by using a mask pattern having the width Wp of the first pattern opening which is calculated by Expression (12) as an etching resist is the same as that of the second opening portion 8A of Embodiment 1, the opening width W2 is the largest, and an etching rate is the fastest. Further, in the first opening portion 6B as the second recessed portion which is formed by wet-etching the first surface 1a by using a mask pattern having the width Wp of the second pattern opening which is calculated by Expression (13) as an etching resist, the opening width has a width intermediate between the opening widths of the opening portions which are formed by the other two expressions, and an etching rate and etching shape forming accuracy are also positioned between those by the other two expressions.

Therefore, according to the inner wall surface combinations of this embodiment, it is possible to form the first ridge portion 4B and the second ridge portion 5B in a state where the predetermined gap Wg of the gap portion is enhanced, and an etching rate is faster than that in the configuration using the first opening portion 6A (refer to FIG. 6) as the recessed portion by the first inner wall surface combination 1CW of Embodiment 1, and therefore, an effect that the manufacturing efficiency is good is obtained.

Further, in the third inner wall surface combination 3CW for first forming the recessed portion in the formation of the gap portion, the first surfaces 321 and 421 from the top portions 4a and 5a are surfaces substantially parallel to the second surface 1b, and therefore, the range of the position where the recessed portion of the second inner wall surface combination 2CW is formed from the first surface 1a side and penetrated to the recessed portion formed from the second surface 1b side becomes relatively wide. Therefore, the allowable range of the formation position of the opening pattern of the etching resist for forming the second inner wall surface combination 2CW on the first surface 1a side can be widened, and thus a decrease in yield due to so-called "mask misalignment" in which the patterning positions of the etching resists which are formed on the first surface 1a side and the second surface 1b side are deviated from each other can be reduced, and therefore, the effect of increasing a manufacturing margin is obtained.

Embodiment 3

Figure 9:
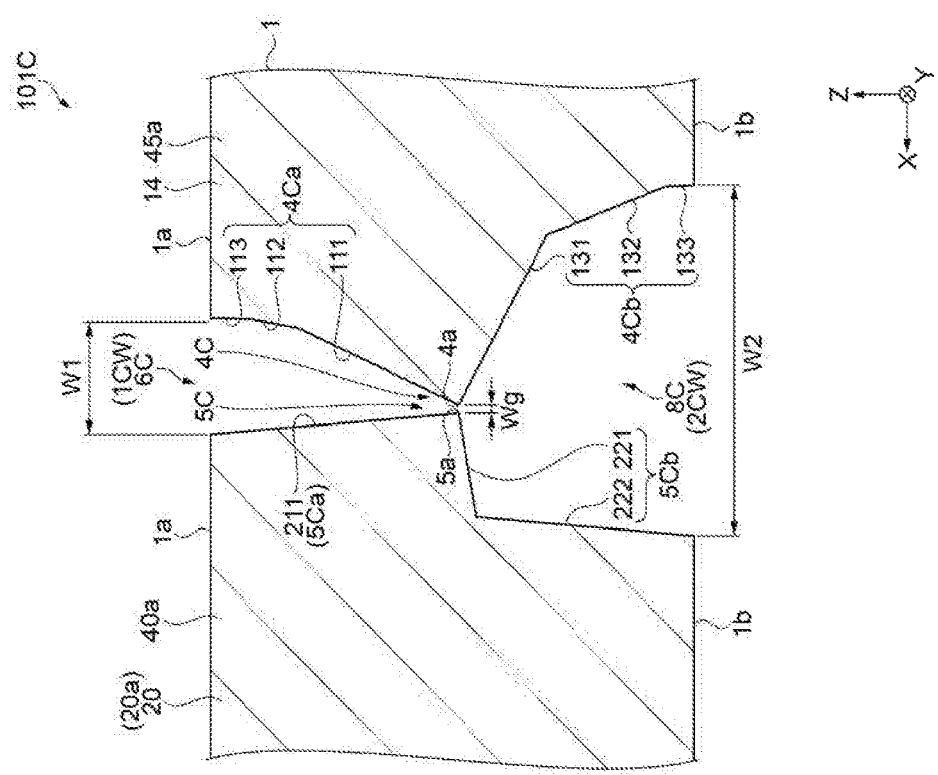
FIG. 9 is a partial cross-sectional view showing a cantilever section according to Embodiment 3 with the same cross section as that in FIG. 6.

FIG. 9 is a partial cross-sectional view showing a cantilever section 101C according to Embodiment 3 with the same cross section as that in FIG. 6. In the following description of this embodiment, the same configurations as those in the embodiments described above are denoted by the same reference numerals and overlapping description is omitted.

In FIG. 9, a gap portion of the cantilever section 101C according to Embodiment 3 is formed by causing a second opening portion 8C which is formed on the second surface 1b side of the quartz crystal substrate 1 and is the second inner wall surface combination 2CW formed on the first surface 1a side in the cantilever section 101B of Embodiment 2 and a first opening portion 6C which is formed on the first surface 1a side and is the same first inner wall surface combination 1CW as that of the first opening portion 6A in the cantilever section 101A of Embodiment 1 to be penetrated to each other at substantially the center in the thickness direction of the quartz crystal substrate 1.

The first opening portion 6C formed in the first surface 1a of the quartz crystal substrate 1 is formed with the first inner wall surface combination 1CW composed of a first inner wall surface 4Ca having the surface 111, the surface 112, and the surface 113 toward the first surface 1a from the top portion 4a of a first ridge portion 4C on the movable section 14 side, and a second inner wall surface 5Ca having a surface 211 extending toward the first surface 1a from the top portion 5a of a second ridge portion 5C on the arm portion 20a side. The first opening portion 6C of the first inner wall surface combination 1CW is formed such that the width of the opening portion (the opening width W1 of the first opening portion 6C) is the narrowest among the three types of inner wall surface combinations according to the invention. Further, the second opening portion 8C formed in the second surface 1b of the quartz crystal substrate 1 is formed with the second inner wall surface combination 2CW composed of a third inner wall surface 4Cb having the surface 131, the surface 132, and the surface 133 toward the second surface 1b from the top portion 4a of the first ridge portion 4C on the movable section 14 side, and a fourth inner wall surface 5Cb having the surface 221 and the surface 222 toward the second surface 1b from the top portion 5a of the second ridge portion 5C on the arm portion 20a side. The opening portion 8C of the second inner wall surface combination 2CW which is formed on the second surface 1b side of the quartz crystal substrate 1 is formed with the second inner wall surface combination 2CW composed of the third inner wall surface 4Cb having the surface 131, the surface 132, and the surface 133 toward the second surface 1b from the top portion 4a of the first ridge portion 4C on the movable section 14 side, and the fourth inner wall surface 5Cb having the surface 221 and the surface 222 toward the second surface 1b from the top portion 5a of the second ridge portion 5C on the arm portion 20a side and is formed such that the width of the opening portion (the width W2 of the second opening portion 8C) has a width intermediate between those of the other two types of inner wall surface combinations among the three types of inner wall surface combinations according to the invention. In the gap portion formed by causing the first opening portion 6C by the first inner wall surface combination 1CW and the second opening portion 8C by the second inner wall surface combination 2CW to be penetrated to each other at substantially the center of the quartz crystal substrate 1, the predetermined gap Wg is formed between the top portion 4a of the first ridge portion 4C formed on the movable section 14 side and the top portion 5a of the second ridge portion 5C formed on the arm portion 20a side. Therefore, the opening width W1 of the first opening portion 6C formed on the first surface 1a side, the opening width W2 of the second opening portion 8C formed on the second surface 1b side, and the predetermined gap Wg of the gap portion have the relationship of Wg<W1<W2. In this way, when forming the cantilever section 101C by wet-etching the quartz crystal substrate 1, by first forming the recessed portion (the second opening portion 8C) by the second inner wall surface combination 2CW having a larger opening width (W2) from the second surface 1b side, thereafter, forming the recessed portion (the first opening portion 6C) by the first inner wall surface combination 1CW having a smaller opening width (W1) from the first surface 1a side, and causing the recess bottom portions of the recessed portions to be penetrated to each other, the predetermined gap Wg of the gap portion which is the gap between the first ridge portion 4C and the second ridge portion 5C is formed. Therefore, the opening width W1 of the first opening portion 6C formed on the first surface 1a side, the opening width W2 of the second opening portion 8C formed on the second surface 1b side, and the predetermined gap Wg of the gap portion have the relationship of Wg<W1<W2. That is, the opening width W1 of the first opening portion 6C formed on the first surface 1a side, the opening width W2 of the second opening portion 8C formed on the second surface 1b side, and the predetermined gap Wg of the gap portion have the relationship of Wg<W1<W2.

In the gap portion of the cantilever section 101C of this embodiment, the width Wp2 of the first pattern opening which is formed by the first corrosion-resistant film pattern 74p for the first etching in the method of manufacturing the cantilever section of Embodiment 1 described above can be determined by satisfying the relationship of the following Expression (14) for forming the shape of the second inner wall surface combination 2CW.

$$0.7735d+0.5 \leq Wp2 \leq 1.9393d+0.2083 \quad (14)$$

Further, the width of the second pattern opening Wp1 which is formed by the second corrosion-resistant film pattern 75p for the second etching for forming the first opening portion 6C on the first surface 1a side can be determined by satisfying the relationship of the following Expression (15) for forming the shape of the first inner wall surface combination 1CW.

$$0 < Wp1 \leq 0.7735d+0.5 \quad (15)$$

Due to forming the width Wp1 of the second pattern opening determined so as to satisfy the relationship of Expression (15), the predetermined gap Wg of the gap portion can be accurately formed by forming the first opening portion 6C having the shape of the first inner wall surface combination 1CW in the second etching of the next process and penetrating the bottom portion (the recess bottom portion) of the second opening portion 8C on the second surface 1b side, formed by the first etching.

According to the cantilever section 101C having the gap portion formed by the inner wall surface combinations of this embodiment, the following effects are obtained.

In this embodiment, the shape of the second opening portion 8C as the first recessed portion which is formed by wet-etching the second surface 1b by using a mask pattern having the width Wp of the first pattern opening which is calculated by Expression (14) as an etching resist is the shape of the second inner wall surface combination 2CW, and the opening width W2 is larger than the opening width W1 of the first opening portion 6C on the first surface 1a side, and an etching rate is relatively fast. Further, in the first opening portion 6C as the second recessed portion which is formed by wet-etching the first surface 1a by using a mask pattern having the width Wp of the second pattern opening which is calculated by Expression (15) as an etching resist, the opening width W1 is the smallest among the inner wall surface combinations according to the invention, and an etching rate is the slowest. Therefore, it is possible to maximize etching shape forming accuracy.

Therefore, according to the inner wall surface combinations of this embodiment, manufacturing efficiency is relatively good, and it is possible to form the first ridge portion 4C and the second ridge portion 5C in which the predetermined gap Wg of the gap portion is accurately formed, while increasing a manufacturing margin.

The invention is not limited to the embodiments described above, and it is possible to add various changes, improvements, or the like to the embodiments described above. Modification examples will be described below.

Hereinafter, modification examples of the cantilever section as the substrate for a sensor in the physical quantity detection sensor will be described with reference to the drawings. The same configurations as those in the embodiments described above are denoted by the same reference numerals and overlapping description is omitted.

Modification Example 1

Figure 10:
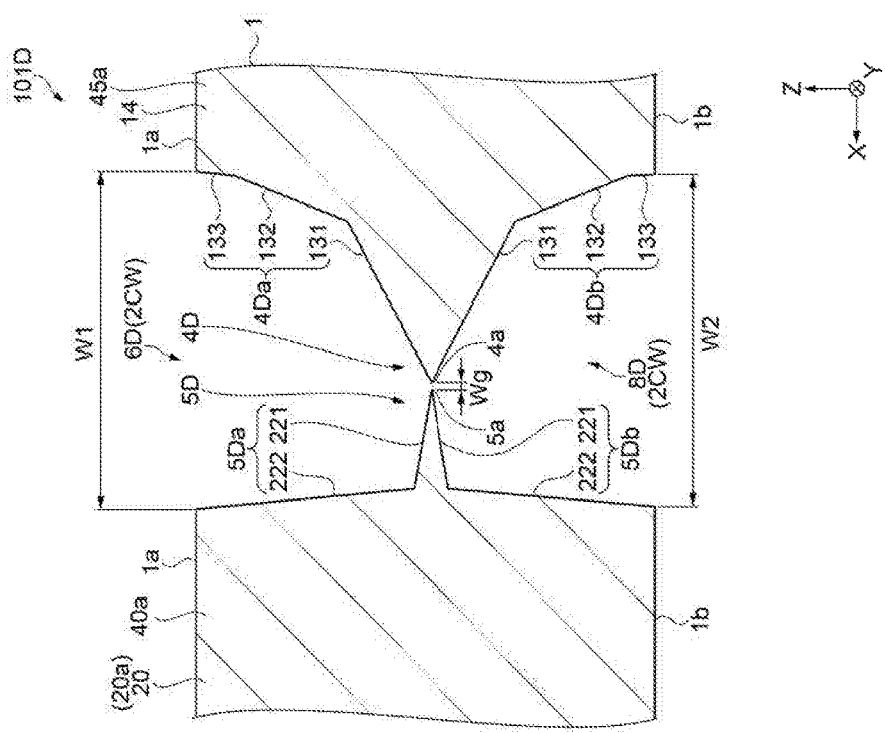
FIG. 10 is a partial cross-sectional view showing Modification Example 1 of the cantilever section with the same cross section as that in FIG. 6.

FIG. 10 is a partial cross-sectional view showing Modification Example 1 of the cantilever section with the same cross section as that in FIG. 6.

In FIG. 10, a gap portion of a cantilever section 101D according to Modification Example 1 is formed to have the shape of the second inner wall surface combination 2CW along with a second opening portion 8D formed on the second surface 1b side of the quartz crystal substrate 1 and a first opening portion 6D formed on the first surface 1a side and is formed by causing the first opening portion 6D and the second opening portion 8D to be penetrated to each other at substantially the center in the thickness direction of the quartz crystal substrate 1.

In the gap portion formed by causing the first opening portion 6D and the second opening portion 8D each having the shape of the second inner wall surface combination 2CW to be penetrated to each other at substantially the center of the quartz crystal substrate 1, the predetermined gap Wg is formed between the top portion 4a of a first ridge portion 4D formed on the movable section 14 side and the top portion 5a of a second ridge portion 5D formed on the arm portion 20a side. Describing in detail the shape of the gap portion, the second opening portion 8D formed in the second surface 1b of the quartz crystal substrate 1 is formed with the third inner wall surface combination 3CW composed of a third inner wall surface 4Db having the surface 321, the surface 322, the surface 323, and the surface 324 toward the second surface 1b from the top portion 4a of the first ridge portion 4D on the movable section 14 side, and a fourth inner wall surface 5Db having the surface 421, the surface 422, and the surface 423 toward the second surface 1b from the top portion 5a of the second ridge portion 5D on the arm portion 20a side, and the first opening portion 6D formed in the first surface 1a of the quartz crystal substrate 1 is formed with the third inner wall surface combination 3CW composed of a first inner wall surface 4Da having the surface 321, the surface 322, the surface 323, and the surface 324 toward the first surface 1a from the top portion 4a of the first ridge portion 4D on the movable section 14 side, and a second inner wall surface 5Da having the surface 421, the surface 422, and the surface 423 toward the first surface 1a from the top portion 5a of the second ridge portion 5D on the arm portion 20a side.

The gap portion of the cantilever section 101D of this modification example can be determined by satisfying the relationship of the following Expression (16) for forming the shape of the second inner wall surface combination 2CW along with the width Wp2 of the first pattern opening which is formed by the first corrosion-resistant film pattern 74p for the first etching, and the width of the second pattern opening Wp1 which is formed by the second corrosion-resistant film pattern 75p for the second etching for forming the first opening portion 6D on the first surface 1a side, in the method of manufacturing the cantilever section of Embodiment 1 described above.

$$0.7735d+0.5 \leq Wp2 \leq 1.9393d+0.2083 \quad (16)$$

The predetermined gap Wg of the gap portion can be accurately formed by forming the width Wp1 of the second pattern opening determined so as to satisfy the relationship of Expression (16), forming the second opening portion 8D having the shape of the second inner wall surface combination 2CW by performing the first etching, thereafter, forming the width Wp2 of the first pattern opening determined so as to satisfy the relationship of Expression (16), forming the first opening portion 6D having the shape of the same second inner wall surface combination 2CW as that in the second opening portion 8D by performing the second etching, and penetrating the bottom portion (the recess bottom portion) of the second opening portion 8D on the second surface 1b side, formed by the first etching.

Further, because of a relatively fast etching rate and the relatively wide penetration position of the recess bottom portion of each opening portion (recessed portion), along with the first opening portion 6D and the second opening portion 8D by the second inner wall surface combination 2CW, the allowable range of mask alignment when forming the first pattern opening and the second pattern opening becomes relatively wide. Therefore, the effect of increasing a manufacturing margin is obtained.

Modification Example 2

Figure 11:
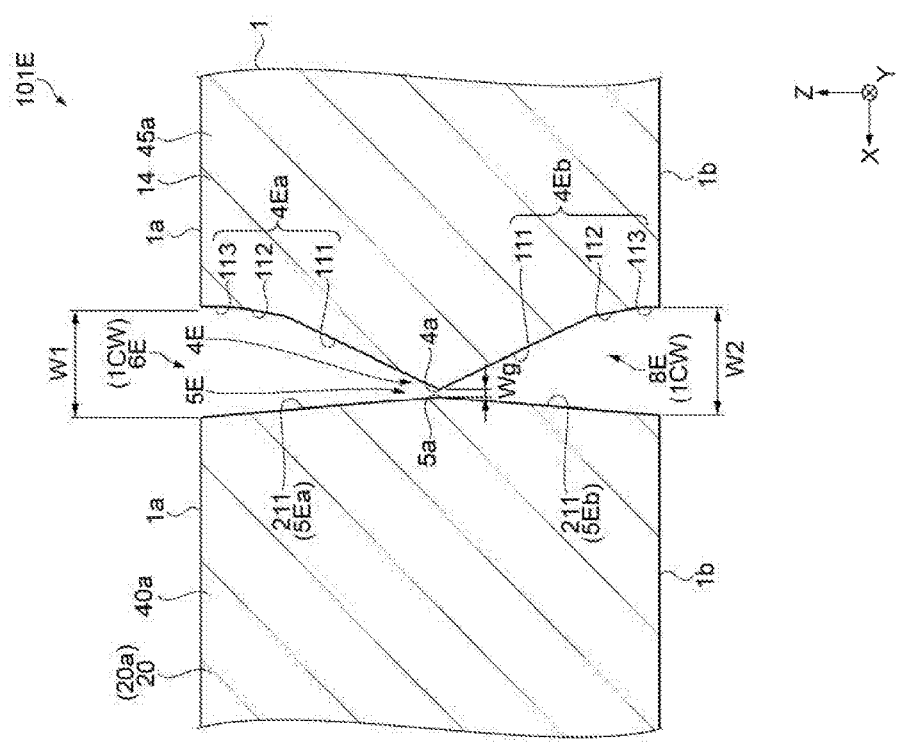
FIG. 11 is a partial cross-sectional view showing Modification Example 2 of the cantilever section with the same cross section as that in FIG. 6.

FIG. 11 is a partial cross-sectional view showing Modification Example 2 of the cantilever section with the same cross section as that in FIG. 6.

In FIG. 11, a gap portion of a cantilever section 101E according to Modification Example 2 is formed to have the shape of the first inner wall surface combination 1CW along with a second opening portion 8E formed on the second surface 1b side of the quartz crystal substrate 1 and a first opening portion 6E formed on the first surface 1a side and is formed by causing the first opening portion 6E and the second opening portion 8E to be penetrated to each other at substantially the center in the thickness direction of the quartz crystal substrate 1.

In the gap portion formed by causing the first opening portion 6E and the second opening portion 8E each having the shape of the first inner wall surface combination 1CW to be penetrated to each other at substantially the center of the quartz crystal substrate 1, the predetermined gap Wg is formed between the top portion 4a of a first ridge portion 4E formed on the movable section 14 side and the top portion 5a of a second ridge portion 5E formed on the arm portion 20a side.

Describing in detail the shape of the gap portion, the second opening portion 8E formed in the second surface 1b of the quartz crystal substrate 1 is formed with the first inner wall surface combination 1CW composed of a third inner wall surface 4Eb having the surface 111, the surface 112, and the surface 113 toward the second surface 1b from the top portion 4a of the first ridge portion 4E on the movable section 14 side, and a fourth inner wall surface 5Eb having the surface 211 extending toward the second surface 1b from the top portion 5a of the second ridge portion 5E on the arm portion 20a side, and the first opening portion 6E formed in the first surface 1a of the quartz crystal substrate 1 is formed with the first inner wall surface combination 1CW composed of a first inner wall surface 4Ea having the surface 111, the surface 112, and the surface 113 toward the first surface 1a from the top portion 4a of the first ridge portion 4E on the movable section 14 side, and a second inner wall surface 5Ea having the surface 211 extending toward the first surface 1a from the top portion 5a of the second ridge portion 5E on the arm portion 20a side.

The gap portion of the cantilever section 101E of this modification example can be determined by satisfying the relationship of the following Expression (17) for forming the shape of the first inner wall surface combination 1CW along with the width Wp2 of the first pattern opening which is formed by the first corrosion-resistant film pattern 74p for the first etching for forming the second opening portion 8E on the second surface 1b side, and the width of the second pattern opening Wp1 which is formed by the second corrosion-resistant film pattern 75p for the second etching for forming the first opening portion 6E on the first surface 1a side, in the method of manufacturing the cantilever section of Embodiment 1 described above.

$$0 < Wp1 \leq 0.7735d + 0.5 \quad (17)$$

The predetermined gap Wg of the gap portion can be accurately formed by forming the width Wp1 of the second pattern opening determined so as to satisfy the relationship of Expression (17), forming the second opening portion 8E having the shape of the first inner wall surface combination 1CW by performing the first etching, thereafter, forming the width Wp2 of the first pattern opening determined so as to satisfy the relationship of Expression (17), forming the first opening portion 6E having the shape of the same first inner wall surface combination 1CW by performing the second etching, and penetrating the bottom portion (the recess bottom portion) of the second opening portion 8E on the second surface 1b side, formed by the first etching.

In particular, along with the first opening portion 6E and the second opening portion 8E by the first inner wall surface combination 1CW according to this modification example, an etching rate is the slowest among the three types of inner wall surface combinations according to the invention, and for this reason, it is possible to increase the accuracy of forming the first ridge portion 4E and the second ridge portion 5E of the gap portion. Therefore, it is possible to form the predetermined gap Wp (G1) of the gap portion with higher accuracy.

Examples

Subsequently, examples of applying the physical quantity detection sensor 100 according to an embodiment of the invention will be described according to the drawings.

Figure 12A:
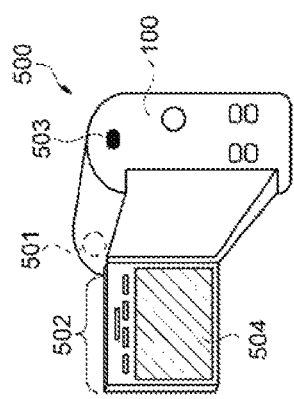
FIG. 12A is a perspective view showing a video camera that is an electronic apparatus equipped with the physical quantity detection sensor.
Figure 12B:
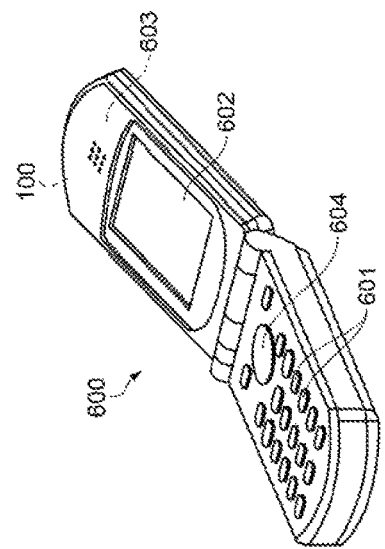
FIG. 12B is a perspective view showing a mobile phone that is an electronic apparatus equipped with the physical quantity detection sensor.
Figure 13:
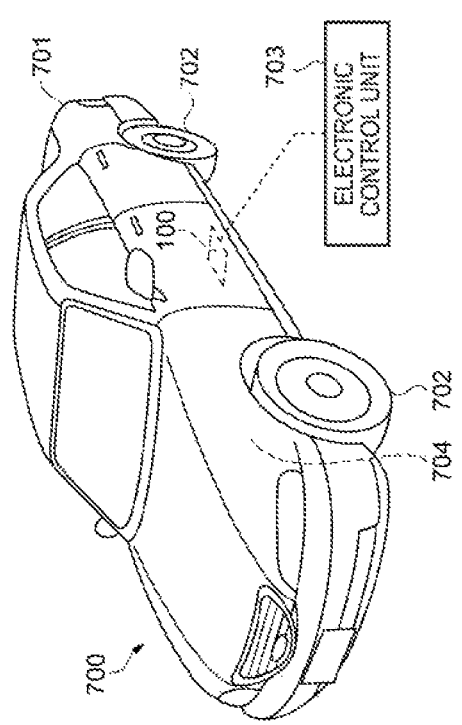
FIG. 13 is a perspective view showing an automobile that is a vehicle equipped with the physical quantity detection sensor.

FIG. 12A is a perspective view showing a video camera equipped with the physical quantity detection sensor 100, FIG. 12B is a perspective view showing a mobile phone equipped with the physical quantity detection sensor 100, and FIG. 13 is a perspective view showing an automobile that is a vehicle equipped with the physical quantity detection sensor 100.

Electronic Apparatus

As shown in FIGS. 12A and 12B, each of a video camera 500 and a mobile phone 600 as an electronic apparatus is equipped with the physical quantity detection sensor 100 according to this embodiment.

First, the video camera 500 shown in FIG. 12A is equipped with an image receiving section 501, an operating section 502, an audio input section 503, and a display unit 504. The video camera 500 is provided with the physical quantity detection sensor 100, and for example, if the video camera 500 is provided with three physical quantity detection sensors 100, it is possible to exhibit a function of detecting physical quantities, for example, acceleration, inclination, or the like, in three directions of the X-axis, the Y-axis, and the Z-axis (not shown), and thereby correcting camera shake or the like. In this way, the video camera 500 can record a clear moving image.

Further, the mobile phone 600 shown in FIG. 12B is equipped with a plurality of operation buttons 601, a display unit 602, a camera mechanism 603, and a shutter button 604 and functions as a phone and a camera. The mobile phone 600 is equipped with the physical quantity detection sensor 100, and for example, if the mobile phone 600 is equipped with three physical quantity detection sensors 100, it is possible to exhibit a function of detecting physical quantities, for example, acceleration, inclination, or the like, in three directions of the X-axis, the Y-axis, and the Z-axis (not shown), and thereby correcting camera shake or the like of the camera mechanism 603. In this way, the mobile phone 600 can record a clear image by the camera mechanism 603.

The physical quantity detection sensor 100 according to an embodiment of the invention can be applied, in addition to the video camera of FIG. 12A and the mobile phone of FIG. 12B, to an electronic apparatus such as a personal computer (a mobile type personal computer), a digital still camera, an ink jet type discharge apparatus (for example, an ink jet printer), a television, a video recorder, a car navigation device, a pager, an electronic notebook (also including that with a communication function), an electronic dictionary, a desk calculator, electronic game equipment, a word processor, a workstation, a videophone, a security television monitor, electronic binoculars, a POS terminal, medical equipment (for example, an electronic thermometer, a sphygmomanometer, a blood glucose meter, an electrocardiogram measuring device, an ultrasound diagnostic device, and an electronic endoscope), a fishfinder, various measurement equipment, meters and gauges (for example, meters and gauges of a vehicle, an aircraft, and a ship), and a flight simulator, for example.

Vehicle

Next, a vehicle using the physical quantity detection sensor 100 will be described. As shown in FIG. 13, a vehicle 700 is an automobile and is equipped with the physical quantity detection sensor 100. In the vehicle 700, the physical quantity detection sensor 100 is built into an electronic control unit (ECU) 703 mounted on a car body 701. For example, the physical quantity detection sensor 100 detects the state of the car body 701 as an acceleration sensor or an inclination sensor, whereby the electronic control unit 703 grasps the attitude, the moving status, or the like of the vehicle 700 and can accurately perform the control of suspensions 704, tires 702, and the like. In this way, the vehicle 700 can perform a safe and stable movement.

Further, the physical quantity detection sensor 100 can be mounted, in addition to being mounted on the electronic apparatus or the vehicle described above, on a keyless entry, an immobilizer, a car navigation system, a car air conditioner, an antilock brake system (ABS), an air bag, a tire pressure monitoring system (TPMS), an engine control, a battery monitor of a hybrid vehicle or an electric vehicle, or an electronic control unit such as a car body attitude control system, and thus the physical quantity detection sensor 100 is applicable to a wide range of fields.

The embodiments of the invention made by the inventors have been specifically described above. However, the invention is not limited to the embodiments described above, and it will be easily understood by those skilled in the art that many modifications can be made with various changes within a scope which does not depart from the gist of the invention. Therefore, all such modifications shall be included in the scope of the invention. For example, in the specification or the drawings, terms described along with different broader or equivalent terms at least once can be replaced with the different terms at any place in the specification or the drawings.

What is claimed is:

1. A substrate for a sensor comprising:
   a base section;
   a movable section connected to the base section, the movable section extending from the base section along an extension direction when viewed in a planar view as viewed from a thickness direction of the movable section, the thickness direction being perpendicular to the extending direction;
   a support portion which extends along the movable section from the base section in the extension direction when viewed in the planar view;
   a gap portion formed to have a predetermined gap in a cross direction between the movable section and the support portion when viewed in the planar view, the cross direction being perpendicular to the extension direction and the thickness direction; and
   a ridge portion on each of facing surfaces of the movable section and the support portion in the gap portion, each ridge portion being formed as an etching residue and having a top portion on the corresponding facing surface,
   the predetermined gap being a gap between a top portion of a first ridge portion which is the ridge portion formed at one of the movable section and the support portion, and a top portion of a second ridge portion which is the ridge portion formed at the other of the movable section and the support portion.

2. The substrate for a sensor according to claim 1, wherein the support portion is a first support portion, the gap portion is a first gap portion, the substrate further comprises a second support portion, extending along the movable section from the base section in the extension direction when viewed in the planar view, and the first support portion and the second support portion are spaced from each other in the cross direction and each disposed on a respective side of the movable section across the extension direction when viewed in the planar view, and
   the substrate comprises a second gap portion in the cross direction between the movable section and the second support portion, and the first gap portion and the second gap portion are each formed on a respective side of the movable section across the extension direction when viewed in the planar view.

3. The substrate for a sensor according to claim 1,
   wherein the substrate has an upper surface and a lower surface which opposes the upper surface in the thickness direction,
   the gap portion comprising:
      a first opening portion at a first surface side between the top portion and one of the upper surface and the lower surface in the thickness direction, the first opening portion having an opening width W1, in the cross direction; and
      a second opening portion at a second surface side between the top portion and the other of the upper surface and the lower surface in the thickness direction, the second opening portion having an opening W2 in the cross direction,
         wherein Wg<W1<W2, Wg being an opening width of the predetermined gap in the cross direction.

4. The substrate for a sensor according to claim 3, wherein at least one of a first inner wall surface which is formed from the top portion of the first ridge portion to the first surface side and a second inner wall surface which is formed from the top portion of the second ridge portion to the first surface side includes a plurality of surfaces, and at least one of a third inner wall surface which is formed from the top portion of the first ridge portion to the second surface side and a fourth inner wall surface which is formed from the top portion of the second ridge portion to the second surface side includes a plurality of surfaces.

5. The substrate for a sensor according to claim 4, wherein one inner wall surface combination out of a combination of the first inner wall surface and the second inner wall surface and a combination of the third inner wall surface and the fourth inner wall surface in the gap portion is one inner wall surface combination among a first inner wall surface combination in which an inner wall surface on one side includes three surfaces and an inner wall surface on the other side includes a single surface, a second inner wall surface combination in which an inner wall surface on one side includes three surfaces and an inner wall surface on the other side includes two surfaces, and a third inner wall surface combination in which an inner wall surface on one side includes four surfaces, an inner wall surface on the other side includes three surfaces, and first surfaces from the top portions, of the inner wall surface on one side and the inner wall surface on the other side, are surfaces substantially parallel to the first surface or the second surface.

6. The substrate for a sensor according to claim 5, wherein the second surface side is the third inner wall surface combination, and the first surface side is the first inner wall surface combination.

7. The substrate for a sensor according to claim 5, wherein the second surface side is the third inner wall surface combination, and the first surface side is the second inner wall surface combination.

8. The substrate for a sensor according to claim 5, wherein the second surface side is the second inner wall surface combination, and the first surface side is the first inner wall surface combination.

9. The substrate for a sensor according to claim 1, wherein the substrate for a sensor is formed using a quartz crystal Z-cut plate cut out in a Z-cut, and the top portion of one of the first ridge portion and the second ridge portion protrudes in an X crystal axis direction of the quartz crystal Z-cut plate.

10. A physical quantity detection sensor comprising:
the substrate for a sensor according to claim 1; and
a physical quantity detection element which has one end portion fixed to the base section and the other end portion fixed to the movable section and detects a physical quantity.

11. A physical quantity detection sensor comprising:
the substrate for a sensor according to claim 2; and
a physical quantity detection element which has one end portion fixed to the base section and the other end portion fixed to the movable section and detects a physical quantity.

12. A physical quantity detection sensor comprising:
the substrate for a sensor according to claim 3; and
a physical quantity detection element which has one end portion fixed to the base section and the other end portion fixed to the movable section and detects a physical quantity.

13. A physical quantity detection sensor comprising:
the substrate for a sensor according to claim 4; and
a physical quantity detection element which has one end portion fixed to the base section and the other end portion fixed to the movable section and detects a physical quantity.

14. An acceleration sensor comprising:
the physical quantity detection sensor according to claim 10,
wherein acceleration is measured by the physical quantity detection sensor.

15. An electronic apparatus comprising:
the physical quantity detection sensor according to claim 10.

16. A vehicle comprising:
the physical quantity detection sensor according to claim 10.

17. A method of manufacturing a substrate for a sensor which includes a base section, a movable section connected to the base section, the movable section extending from the base section along an extension direction when viewed in a planar view as viewed from a thickness direction of the movable section, the thickness direction being perpendicular to the extending direction;

a support portion which extends along the movable section from the base section in the extension direction when viewed in the planar view;

a gap portion formed to have a predetermined gap in a cross direction between the movable section and the support portion when viewed in the planar view, the cross direction being perpendicular to the extension direction and the thickness direction; and a ridge portion on each of facing surfaces of the movable section and the support portion in the gap portion, each ridge portion being formed as an etching residue and having a top portion on the corresponding facing surface, the predetermined gap being a gap between a top portion of a first ridge portion which is the ridge portion formed at one of the movable section and the support portion, and a top portion of a second ridge portion which is the ridge portion formed at the other of the movable section and the support portion, the method comprising:

forming a first corrosion-resistant film and a second corrosion-resistant film on an upper surface and a lower surface, respectively, of a substrate forming material;

forming a first pattern opening by forming a first photoresist layer and a second photoresist layer respectively on the first corrosion-resistant film and the second corrosion-resistant film, patterning the first photoresist layer to expose a part of the second corrosion-resistant film, and removing the exposed part of the second corrosion-resistant film to expose a part of the lower surface of the substrate forming material;

first etching for forming a first recessed portion in the substrate forming material by wet-etching the lower surface of the substrate forming material exposed in the first pattern opening;

covering at least an inner surface of the first recessed portion with a protective film;

forming a second pattern opening by patterning the second photoresist layer on the first corrosion-resistant film to expose a part of the first corrosion-resistant film and removing the exposed part of the first corrosion-resistant film to expose a part of the upper surface of the substrate forming material; and second etching for forming the gap portion by penetrating a recess bottom portion of a second recessed portion which is formed by wet-etching the upper surface of the substrate forming material exposed in the second pattern opening, to the first recessed portion, when a width in the same direction as the predetermined gap, of each of the first pattern opening and the second pattern opening, is set to be Wp, an etching depth of the substrate forming material in the first etching or the second etching is set to be d, and a limit value of the amount of displacement of the movable section is set to be Wgmax, the relationship of one of the following Expressions (1) to (3) being satisfied:

$$0 < Wp \le 0.7735d + 0.5 \quad (1)$$

$$0.7735d + 0.5 \le Wp \le 1.9393d + 0.2083 \quad (2)$$

$$1.9393d + 0.2083 \le Wp \le Wg\max + 1.956d \quad (3).$$

18. The method of manufacturing a substrate for a sensor according to claim 17, wherein the width Wp of the first pattern opening satisfies:

$$1.9393d + 0.2083 \le Wp \le Wg\max + 1.956d, \text{ and}$$

the width Wp of the second pattern opening satisfies:

$$0 < Wp \le 0.7735d + 0.5.$$

19. The method of manufacturing a substrate for a sensor according to claim 17, wherein the width Wp of the first pattern opening satisfies:

$$1.9393d + 0.2083 \le Wp \le Wg\max + 1.956d, \text{ and}$$

the width Wp of the second pattern opening satisfies:

$$0.7735d + 0.5 \le Wp \le 1.9393d + 0.2083.$$

20. The method of manufacturing a substrate for a sensor according to claim 17, wherein the width Wp of the first pattern opening satisfies:

$$1.9393d + 0.2083 \le Wp \le Wg\max + 1.956d, \text{ and}$$

the width Wp of the second pattern opening satisfies:

$$0 < Wp \le 0.7735d + 0.5.$$

21. A substrate for a sensor comprising:

a base section;

a movable section connected to the base section, the movable section extending from the base section along an extension direction when viewed in a planar view as viewed from a thickness direction of the movable section, the thickness direction being perpendicular to the extending direction;

a support portion which is spaced apart from the movable section in a cross direction when viewed in the planar view, the cross direction being perpendicular to the extension direction and the thickness direction, and extends along the movable section from the base section in the extension direction when viewed in the planar view;

a gap portion formed in the cross direction between the movable section and the support portion when viewed in the planar view, the gap portion having a depth in the thickness direction, a facing surface of the movable section in the gap portion and a facing surface of the support portion in the gap portion facing each other across the gap portion; and a ridge portion on each of the facing surfaces of the movable section and the support portion, each ridge portion having a top portion in the gap portion and on the corresponding facing surface, each top portion protruding in the cross section direction, the gap portion having a predetermined gap between a top portion of a first ridge portion which is the ridge portion formed at one of the movable section and the support portion, and a top portion of a second ridge portion which is the ridge portion formed at the other of the movable section and the support portion.

\* \* \* \* \*